(12) United States Patent
Choi et al.

(10) Patent No.: US 11,437,782 B2
(45) Date of Patent: Sep. 6, 2022

(54) VERTICAL CAVITY SURFACE EMITTING LASER

(71) Applicant: Rayir, Co., Suwon-Si (KR)

(72) Inventors: Won Jin Choi, Suwon-Si (KR); Dong Hwan Kim, Seoul (KR); Keuk Kim, Yongin-si (KR)

(73) Assignee: Rayir, Co., Suwon-Si (KR)

( * ) Notice: Subject to any disclaimer, the term of this patent is extended or adjusted under 35 U.S.C. 154(b) by 248 days.

(21) Appl. No.: 16/490,566

(22) PCT Filed: Feb. 11, 2019

(86) PCT No.: PCT/KR2019/001610
§ 371 (c)(1),
(2) Date: Sep. 2, 2019

(87) PCT Pub. No.: WO2019/194406
PCT Pub. Date: Oct. 10, 2019

(65) Prior Publication Data
US 2021/0336419 A1      Oct. 28, 2021

(30) Foreign Application Priority Data

Apr. 2, 2018  (KR) .................... 10-2018-0038231
May 28, 2018  (KR) .................... 10-2018-0060072
Jan. 17, 2019  (KR) .................... 10-2019-0006178

(51) Int. Cl.
*H01S 5/183*    (2006.01)
*H01S 5/042*    (2006.01)

(52) U.S. Cl.
CPC ...... *H01S 5/18311* (2013.01); *H01S 5/04256* (2019.08); *H01S 5/18361* (2013.01)

(58) Field of Classification Search
CPC ............. H01S 5/18311; H01S 5/04256; H01S 5/18361
See application file for complete search history.

(56) References Cited

U.S. PATENT DOCUMENTS 6,185,241 B1 *   2/2001   Sun ..................... H01S 5/04253
                                                                    372/96
2001/0050934 A1 * 12/2001  Choquette .............. B82Y 20/00
                                                                    372/50.11
(Continued)

FOREIGN PATENT DOCUMENTS

JP    2012-114185     6/2012
KR    10-2004-0054217 6/2004
(Continued)

OTHER PUBLICATIONS

Notification of Office Action and Search Report dated Aug. 31, 2020 From the State Intellectual Property Office of the People's Republic of China Re. Application No. 201980001906.6. (7 Pages).
(Continued)

*Primary Examiner* — Yuanda Zhang

(57) ABSTRACT

An embodiment discloses a vertical cavity surface emitting laser including a substrate, a lower reflective layer disposed on the substrate, a laser cavity including an active layer and disposed on the lower reflective layer, an oxide layer disposed on the laser cavity, an upper reflective layer disposed on the oxide layer, a plurality of first holes formed in the upper reflective layer and the oxide layer, and an upper electrode disposed on inner sides of the plurality of first holes and disposed on the upper reflective layer, wherein the oxide layer includes a plurality of light emitting regions spaced apart from each other, and the plurality of first holes are disposed to surround each of the light emitting regions in a plan view.

6 Claims, 17 Drawing Sheets

(56) References Cited

U.S. PATENT DOCUMENTS

| | | | |
|---|---|---|---|
| 2007/0091960 A1* | 4/2007 | Gauggel | H01S 5/423 |
| | | | 372/50.124 |
| 2008/0187015 A1 | 8/2008 | Yoshikawa et al. | |
| 2011/0027924 A1* | 2/2011 | Ikuta | H01S 5/18333 |
| | | | 438/29 |
| 2017/0033535 A1 | 2/2017 | Joseph | |

FOREIGN PATENT DOCUMENTS

| | | |
|---|---|---|
| KR | 10-1086788 | 11/2011 |
| KR | 10-1818725 | 1/2018 |
| KR | 10-2018-0015630 | 2/2018 |
| WO | WO 2016/198282 | 12/2016 |

OTHER PUBLICATIONS

International Search Report dated May 24, 2019 From the International Searching Authority Re. Application No. PCT/KR2019/001610. (3 Pages).

* cited by examiner

FIG. 1
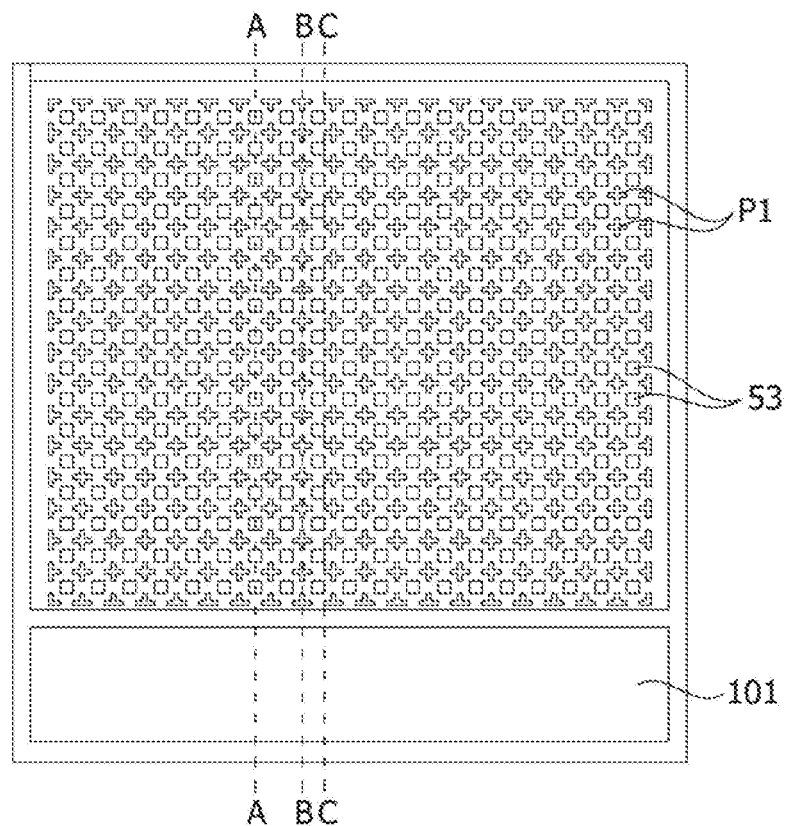
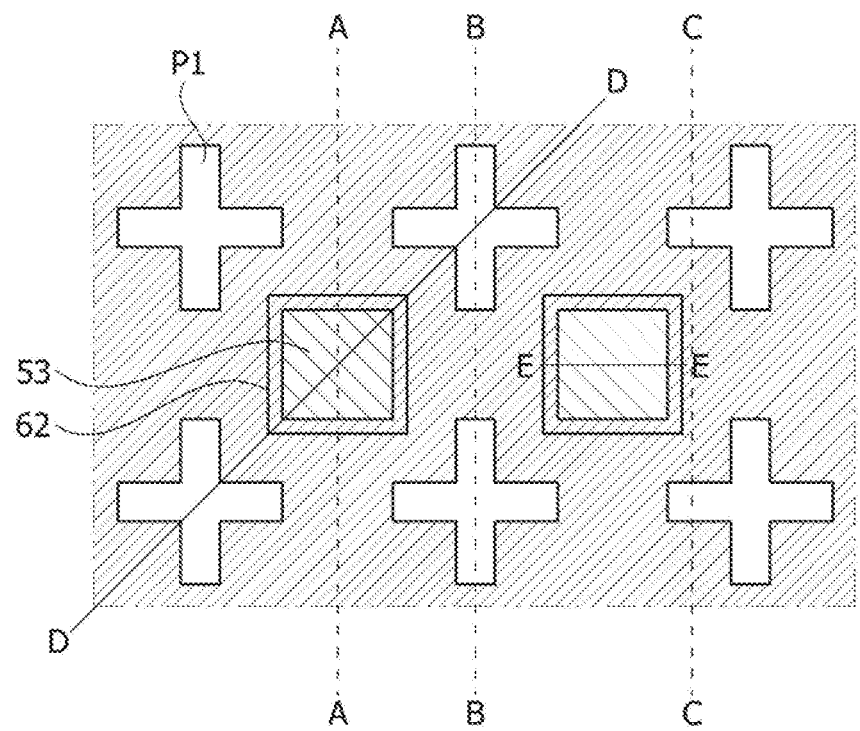
FIG. 2

FIG. 15
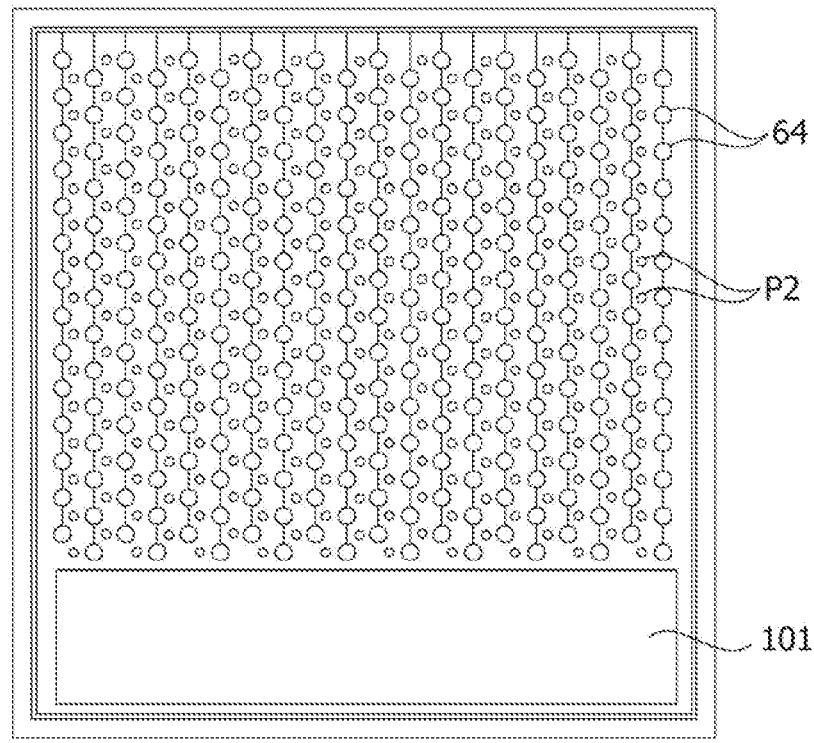
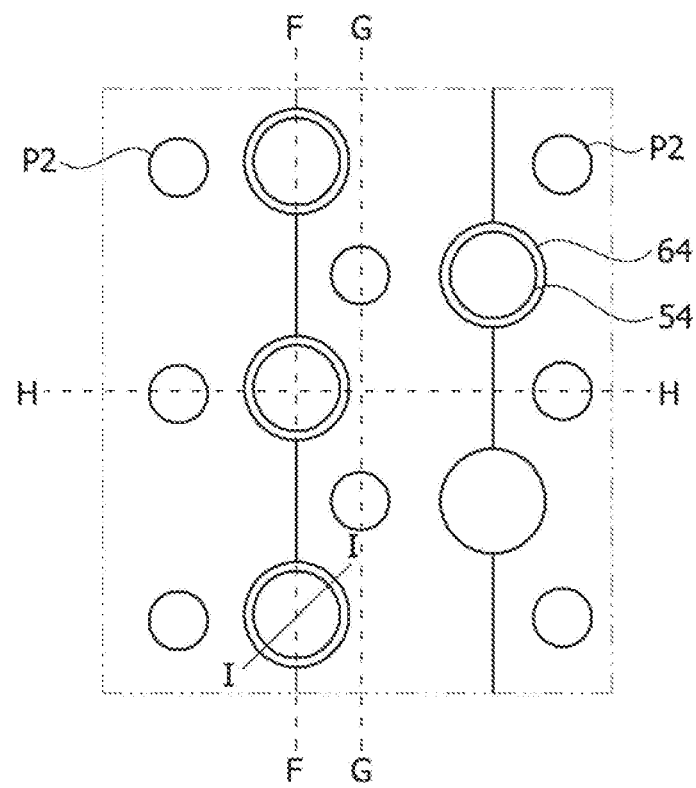
FIG. 16

VERTICAL CAVITY SURFACE EMITTING LASER

RELATED APPLICATIONS

This application is a National Phase of PCT Patent Application No. PCT/KR2019/001610 having International filing date of Feb. 11, 2019, which claims the benefit of priority of Korean Patent Applications Nos. 10-2018-0038231 filed on Apr. 2, 2018, 10-2018-0060072 filed on May 28, 2018 and 10-2019-0006178 filed on Jan. 17, 2019. The contents of the above applications are all incorporated by reference as if fully set forth herein in their entirety.

FIELD AND BACKGROUND OF THE INVENTION

The present invention relates to a vertical cavity surface emitting laser.

Vertical cavity surface emitting lasers (VCSELs) can oscillate in a single longitudinal mode in a narrow spectrum and have high coupling efficiency because a radiation angle of a beam thereof is small.

Recently, studies on technologies for manufacturing light source matrixes by structuring the VCSELs in two-dimensional array forms are actively being carried out. When the light source matrixes structured in the two-dimensional array forms emit light on objects and analyze patterns of reflected light, three-dimensional images of the objects can be generated.

Since photoconversion efficiency of the general VCSEL ranges from 34 to 40%, when the VCSEL operates, about 60 to 66% of power energy changes to heat. Accordingly, a temperature in the VCSEL increases, and thus light efficiency decreases significantly during a high current operation.

The rise in the internal temperature of the VCSEL is due to a self-heating phenomenon due to Joule heating, and it is essential to decrease a series resistance of an element so as to decrease the self-heating. In addition, when a junction temperature increases by 10° C., 50% or more of a lifespan of the element can decrease.

Accordingly, it is important to decrease the resistance of the element to realize a high-efficiency and long-lifespan VCSEL element.

In a case in which a plurality of emitters of lasers are formed in an array form, when the array is formed through the conventional manufacturing method, since a contact area of a semiconductor layer in contact with an ohmic electrode should be small, there is a problem in that a contact resistance increases. Accordingly, there is a limitation to decreasing an operating voltage.

SUMMARY OF THE INVENTION

The present invention is directed to providing a vertical cavity surface emitting laser capable of decreasing a contact resistance by increasing a contact area of an ohmic electrode.

The present invention is directed to providing a superior vertical cavity surface emitting laser which has high photoconversion efficiency and outputs high optical power by increasing a density of unit light emitting regions (emitters) which emit lasers.

Objectives to be solved by embodiments are not limited to the above-described objective and will include objectives and effects which can be identified by solutions for the objectives and the embodiments described below.

According to an aspect of the present invention, there is provided a vertical cavity surface emitting laser including a substrate, a lower reflective layer disposed on the substrate, a laser cavity including an active layer and disposed on the lower reflective layer, an oxide layer disposed on the laser cavity, an upper reflective layer disposed on the oxide layer, a plurality of first holes formed in the upper reflective layer and the oxide layer, and an upper electrode disposed on inner sides of the plurality of first holes and on the upper reflective layer, wherein the oxide layer includes a plurality of light emitting regions spaced apart from each other, and the plurality of first holes are disposed to surround each of the light emitting regions in a plan view.

BRIEF DESCRIPTION OF THE SEVERAL VIEWS OF THE DRAWINGS

The above and other objects, features and advantages of the present invention will become more apparent to those of ordinary skill in the art by describing exemplary embodiments thereof in detail with reference to the accompanying drawings, in which:

FIG. 1 is a plan view illustrating a vertical cavity surface emitting laser according to one embodiment of the present invention;

FIG. 2 is a partially enlarged view of FIG. 1;

FIG. 15 is a plan view illustrating a vertical cavity surface emitting laser according to another embodiment of the present invention;

FIG. 16 is a partially enlarged view of FIG. 15;

DESCRIPTION OF SPECIFIC EMBODIMENTS OF THE INVENTION

Figure 3:
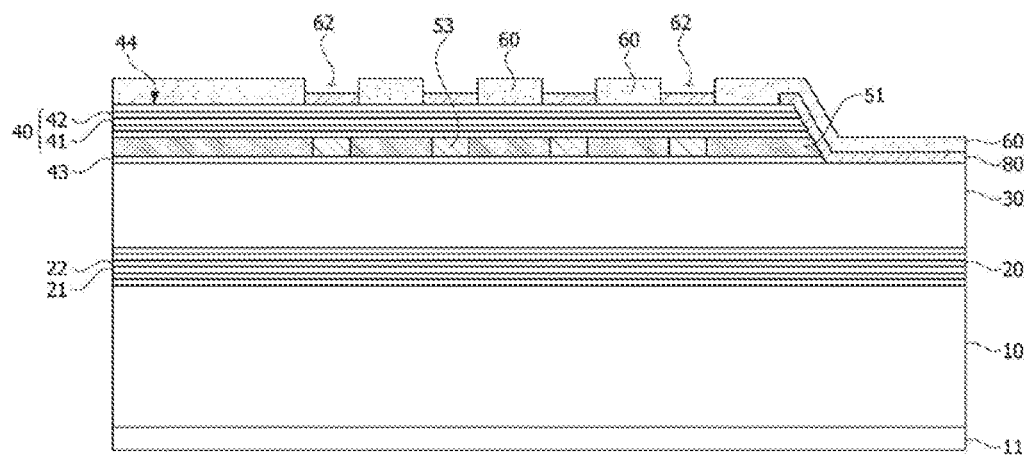
FIG. 3 is a cross-sectional view taken along line A-A of FIG. 1.

As the present invention allows for various changes and numerous embodiments, specific embodiments will be illustrated in the drawings and described in detail in the written description. However, this is not intended to limit the present invention to specific embodiments, and it is to be appreciated that all changes, equivalents, and substitutes that do not depart from the spirit and technical scope of the present invention are encompassed in the present invention.

It will be understood that, although the terms "first," "second," etc. may be used herein to describe various elements, these elements should not be limited by these terms. These terms are only used to distinguish one element from another. For example, a first element could be termed a second element, and a second element could similarly be termed a first element without departing from the scope of the present invention. As used herein, the term "and/or" includes combinations or any one of a plurality of associated listed items.

It will be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements.

The terminology used herein is for the purpose of describing particular embodiments only and is not intended to be limiting to the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, components, and/or groups thereof but do not preclude the presence or addition of one or more other features, integers, steps, operations, elements, components, and/or groups thereof.

Unless otherwise defined, all terms (including technical and scientific terms) used herein are to be interpreted as is customary in the art to which this invention belongs. It should be further understood that terms in common usage should also be interpreted as is customary in the relevant art and not in an idealized or overly formal sense unless expressly so defined herein.

Example embodiments of the invention will be described below in more detail with reference to the accompanying drawings. Components that are the same or correspond to each other are denoted by the same reference numeral regardless of the figure number, and redundant descriptions will be omitted.

FIG. 1 is a plan view illustrating a vertical cavity surface emitting laser according to one embodiment of the present invention, and FIG. 2 is a partially enlarged view of FIG. 1.

Referring to FIGS. 1 and 2, in the vertical cavity surface emitting laser (VCSEL) according to the embodiment, a plurality of light emitting regions 53 arrayed in a matrix form are disposed, and a plurality of first holes P1 may be disposed to surround the light emitting regions 53. As will be described below, the plurality of first holes P1 may serve to perform an oxidation process by exposing an oxide layer therethrough.

The matrix form may be defined as a form in which a plurality of light emitting regions 53 are disposed in rows to be spaced apart from each other in a horizontal direction and the plurality of rows are disposed in a vertical direction.

When power is applied to laser elements in the matrix form, laser light may be emitted through the light emitting regions 53. Accordingly, there is an advantage in that a plurality of laser lights may be emitted from one laser element. FIG. 3 is a cross-sectional view taken along line A-A of FIG. 1, FIG. 4 is a cross-sectional view taken along line B-B of FIG. 1, FIG. 5 is a cross-sectional view taken along line C-C of FIG. 1, and FIG. 6 is a cross-sectional view taken along line D-D of FIG. 1.

Figure 4:
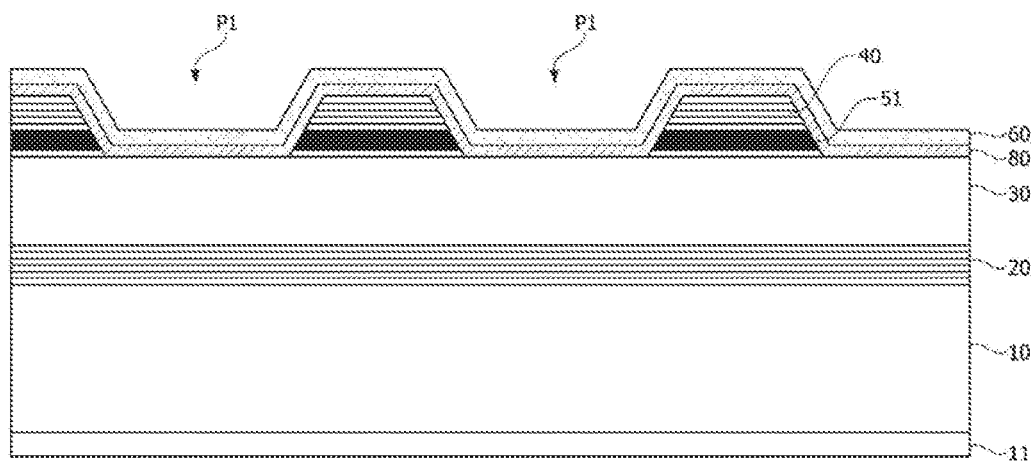
FIG. 4 is a cross-sectional view taken along line B-B of FIG. 1.
Figure 5:
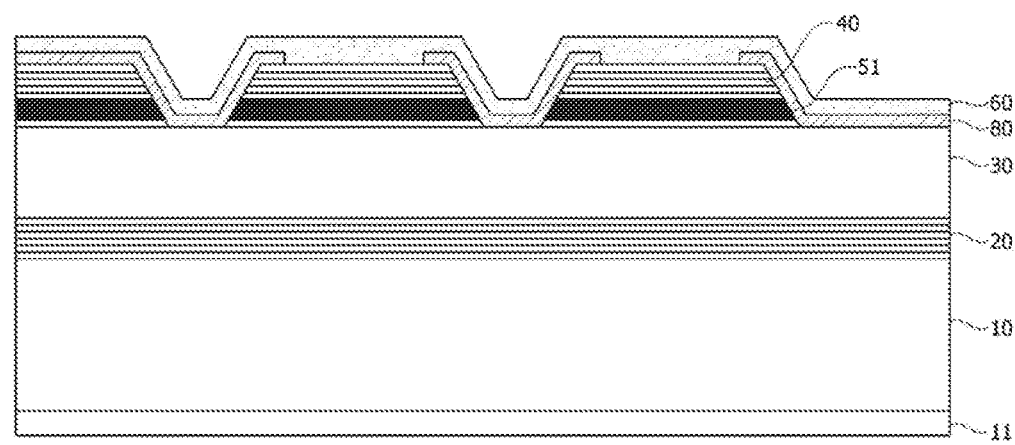
FIG. 5 is a cross-sectional view taken along line C-C of FIG. 1.
Figure 6:
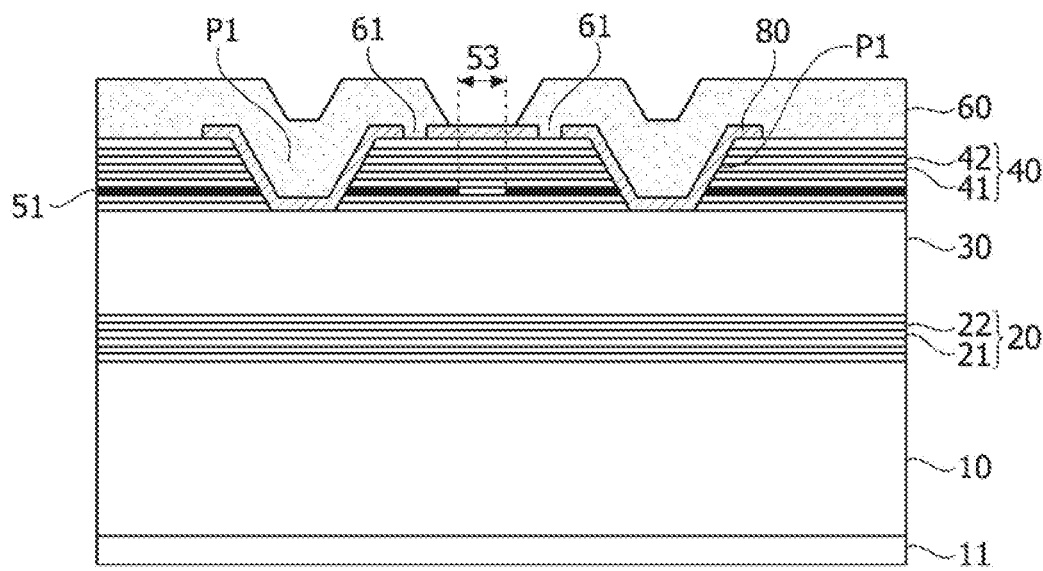
FIG. 6 is a cross-sectional view taken along line D-D of FIG. 1.

Referring to FIG. 3, FIG. 4 and FIG. 5, the VCSEL according to the embodiment may include a substrate 10, a lower reflective layer 20 disposed on the substrate 10, a laser cavity 30 including an active layer disposed on the lower reflective layer 20, an oxide layer 51 disposed on the laser cavity 30, an upper reflective layer 40 disposed on the oxide layer 51, and an upper electrode 60 disposed on inner sides of the plurality of first holes P1 and on the upper reflective layer 40.

In a conventional structure, an upper reflective layer 40 and an oxide layer 51 are divided into a plurality of light emitting portions (emitters), but in the present embodiment, the upper reflective layer 40 differs therefrom in that one layer is formed in which the plurality of first holes P1 are formed, and the oxide layer 51 also differs therefrom in that one layer is formed in which the plurality of first holes P1 are formed.

The substrate 10 may be a semi-insulating or conductive substrate 10. For example, the substrate 10 may be a GaAs substrate with a high doping concentration, and the doping concentration may range from about $1\times10^7$ cm$^{-3}$ to $1\times10^{19}$ cm$^{-3}$. As necessary, a buffer layer such as an AlGaAs or GaAs thin film may be further disposed on the substrate 10, but the present invention is not necessarily limited thereto.

The lower reflective layer 20 may include a distributed Bragg reflector (DBR) having an N-type superlattice structure. The lower reflective layer 20 may be epitaxially deposited on the substrate 10 through a metal-organic chemical vapor deposition (MOCVD) method, a molecular beam epitaxy (MBE) method, or the like.

The lower reflective layer 20 may serve an internal reflection function in a VCSEL structure. In the lower reflective layer 20, a plurality of first lower reflective layers 21 and a plurality of second lower reflective layers 22 may be alternately stacked. Both of the first lower reflective layers 21 and the second lower reflective layers 22 may be formed of AlGaAs or AlGaAsP, and a proportion of aluminum in each of the first lower reflective layers 21 may be greater than a proportion of aluminum in each of the second lower reflective layers 22.

Each of the first lower reflective layer 21 and the second lower reflective layer 22 may have an effective optical thickness of about ¼ of a wavelength of light generated by the VCSEL. In addition, each of the first lower reflective layer 21 and the second lower reflective layer 22 may have a reflectivity of about 100% so as to have a high internal reflectivity of the VCSEL.

A reflectivity of the lower reflective layer 20 may depend on a difference in refractive index between the first lower reflective layer 21 and the second lower reflective layer 22 and on the number of the first lower reflective layers 21 and the second lower reflective layers 22 which are stacked. Accordingly, in order to obtain high reflectivity to secure high VCSEL properties, it may be advantageous when a difference in refractive index is larger and the number of the stacked layers is smaller.

The laser cavity 30 may include one or more well layers and barrier layers. The well layer may be formed of one selected from among GaAs, AlGaAs, AlGaAsSb, InAlGaAs, AlInGaP, GaAsP, and InGaAsP, and the barrier layer may be formed of one selected from among AlGaAs, InAlGaAs, InAlGaAsP, AlGaAsSb, GaAsP, AlGaAsP, GaInP, AlInGaP, and InGaAsP.

The laser cavity 30 may be designed to provide a sufficient optical gain. For example, the laser cavity 30 according to the embodiment may include a center having the well layer which has a thickness and a composition ratio which are suitable for emitting light in a wavelength band ranging from about 800 nm to 900 nm. However, a wavelength band of a laser output by the well layer is not specifically limited.

The laser cavity 30 may include a first semiconductor layer (not shown) disposed under the active layer and a second semiconductor layer (not shown) disposed on the active layer. The first semiconductor layer may be an N-type semiconductor layer, the second semiconductor layer may be a P-type semiconductor layer, but the present invention is not necessarily limited thereto. Each of the first semiconductor layer and the second semiconductor layer may be undoped with a dopant. For example, each of the first semiconductor layer and the second semiconductor layer may be formed of AlGaAs but is not necessarily limited thereto.

The oxide layer 51 may be disposed on the laser cavity 30. The oxide layer 51 may be doped with a dopant which is the same kind as that of the upper reflective layer 40. For example, the oxide layer 51 may be doped with a P-type dopant having a concentration of about $10^{18}$ cm$^{-3}$ but is not necessarily limited thereto.

The oxide layer 51 may include a semiconductor compound including aluminum such as AlAs, AlGaAs, and InAlGaAs. The light emitting regions 53 in which central portions are not oxidized may be disposed in the oxide layer 51 according to the embodiment. That is, the oxide layer 51 may have oxidation regions which have polygonal shapes in which the light emitting regions 53 are formed at centers thereof.

The oxide layer 51 may have a relatively high resistance but have a relatively low refractive index. Accordingly, since a current may flow into the light emitting regions 53, laser light can be collected at a center of the element.

An intermediate layer 43 may be disposed between the laser cavity 30 and the oxide layer 51. The intermediate layer 43 may include a first intermediate layer and a second intermediate layer. The first intermediate layer may have a composition which is the same as that of first upper reflective layer 41. In addition, the second intermediate layer may have a composition which is the same as that of the second upper reflective layer 42. For example, the first intermediate layer may be formed of GaAs, and the second intermediate layer may be formed of AlGaAs.

Generally, when the oxide layer 51 is oxidized, a material is changed to an amorphous material, and thus film quality may be slightly degraded. Accordingly, when an amorphous layer in which film quality is slightly degraded is in direct contact with the laser cavity 30 in which light is generated, reliability of the element may be degraded. Accordingly, since the second intermediate layer is formed before the oxide layer 51, the amorphous layer may be prevented from being in direct contact with the laser cavity 30.

The upper reflective layer 40 may be disposed on the oxide layer 51. The upper reflective layer 40 may include the plurality of first upper reflective layers 41 and the second upper reflective layers 42.

The first upper reflective layer 41 may include AlGaAs, and the second upper reflective layer 42 may include GaAs. Accordingly, a proportion of aluminum of the first upper reflective layer 41 may be greater than that of the second upper reflective layer 42.

The upper reflective layer 40 may be doped to have a polarity which is different from that of the lower reflective layer 20. For example, when each of the lower reflective layer 20 and the substrate 10 is doped with an N-type dopant, the upper reflective layer 40 may be doped with a P-type dopant.

In order to emit laser light in a direction opposite from the substrate 10, the upper reflective layer 40 may have layers in which the number thereof is less than the number of layers of the lower reflective layer 20 to decrease a reflectivity from the VCSEL. That is, the reflectivity of the upper reflective layer 40 may be lower than that of the lower reflective layer 20.

The upper electrode 60 may be disposed on the upper reflective layer 40, and the lower electrode 11 may be disposed under the substrate 10. However, the present invention is not necessarily limited thereto, and an upper portion of the substrate 10 may be exposed, and the lower electrode 11 may be disposed on the exposed portion. The upper electrode 60 may be a P-type ohmic electrode, and the lower electrode 11 may be an N-type ohmic electrode. The upper electrode 60 may be electrically connected to a pad electrode 101.

Each of the upper electrode 60 and the lower electrode 11 may be formed to include at least one among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrO$_x$, RuO$_x$, NiO, RuO$_x$/ITO, Ni/IrO$_x$/Au or Ni/IrO$_x$/Au/ITO, Ag, Ni, Cr, Ti, Al, Rh, Pd, Ir, Sn, In, Ru, Mg, Zn, Pt, Au, and Hf but is not limited to such materials.

For example, the upper electrode 60 may include a plurality of metal layers (for example, Ti/Pt/Au). Here, a thickness of a Ti layer may range from about 100 to 400 Å, and a thickness of an Au layer may range from 3,000 to 20,000 Å, but the present invention is not necessarily limited thereto.

The lower electrode 11 may include a plurality of metal layers (for example, AuGe/Ni/Au). Here, a thickness of an AuGe layer may be 1,000 Å, a thickness of an Ni layer may be 100 Å, and a thickness of an Au layer may be 2,000 Å, but the present invention is not necessarily limited thereto.

An ohmic layer 44 may be further disposed between the upper electrode 60 and the upper reflective layer 40. The ohmic layer 44 may include a material having a band gap which is less than or equal to that of the GaAs substrate 10 and is less than or equal to that of energy of emitted laser light.

For example, the ohmic layer may be formed of one selected from among AlInGaAs, InGaAs, GaAs, AlInGaAsSb, AlInGaAsPSb, InGaAsP, InGaAsPSb, GaAsSb, InGaAsSb, InAsSb, AlGaAsSb, AlGaAsP, and AlGaInAsP.

Referring to FIG. 6, the insulating layer 80 may be disposed on inner sides of the first holes P1 to prevent the upper electrode 60 from being in direct contact with the laser cavity 30. Accordingly, since a current flows into the laser cavity 30 only through the light emitting regions 53 of the oxide layer 51, light can be concentrated. In addition, the insulating layer 80 may be disposed between the light emitting regions 53 and second holes to prevent the light emitting regions 53 from being exposed to the outside.

The first holes P1 may be formed to pass through the upper reflective layer 40 and the oxide layer 51. Accordingly, since the oxide layer 51 may be exposed to the outside through the first holes P1, the oxide layer 51 may be oxidized. When an oxidation time period is controlled, a diameter of each of the light emitting regions 53 may be controlled.

Figure 7:
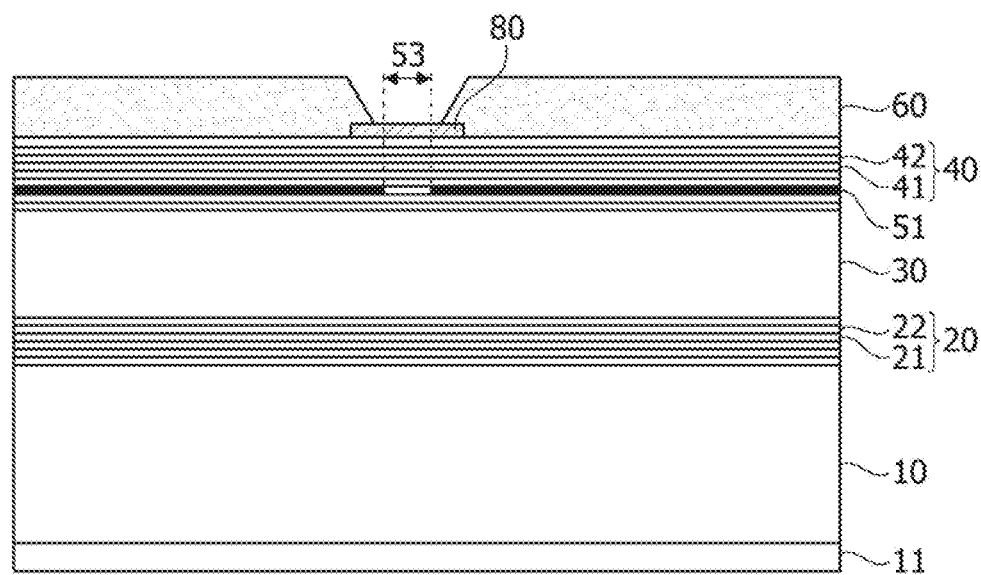
FIG. 7 is a cross-sectional view taken along line E-E of FIG. 1.

Referring to FIG. 7, regions, in which the first holes P1 are not formed, of the upper electrode 60 may be electrically connected to be formed as one layer. In addition, the insulating layer 80 may be removed from regions in which the first holes P1 are not formed, and thus an area in which the upper electrode 60 is electrically connected to the upper reflective layer 40 may be increased.

A series resistance of the VCSEL element may be the sum of a contact resistance and a resistance of the semiconductor layer, and a contact resistance which greatly affects the series resistance of the element is inversely proportional to a contact area. Accordingly, when the contact resistance is decreased, an operating voltage can be decreased. Accordingly, since an increase in a temperature in the VCSEL can be reduced, photoconversion efficiency is high, light with high output power can be emitted, and a lifespan thereof can be increased.

Figure 8:
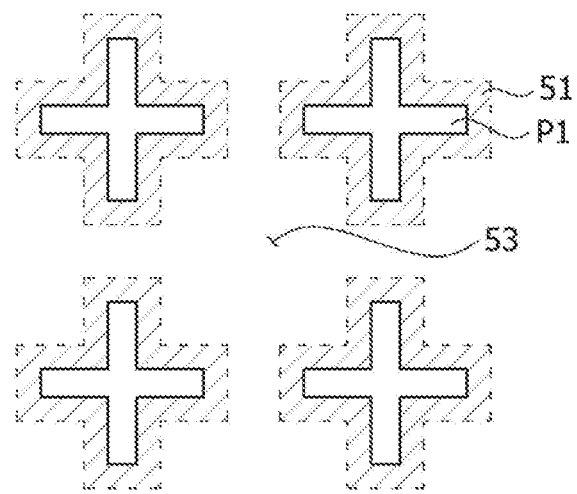
FIGS. 8 and 9 are views showing a process in which an oxide layer exposed to the outside through first holes is oxidized.
Figure 9:
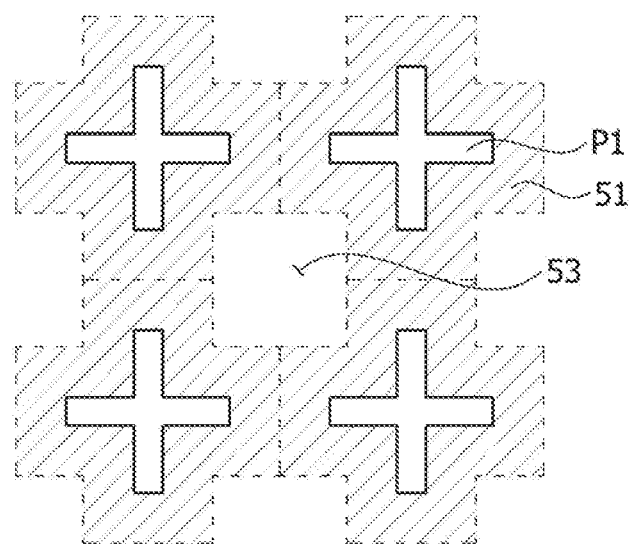

FIGS. 8 and 9 are views showing a process in which an oxide layer exposed to the outside through first holes is oxidized.

Referring to FIG. 8, when the oxide layer 51 exposed through the first holes P1 is exposed to water vapor, oxidation is performed along shapes of the first holes P1. Then, when oxidation regions come into contact with each other as illustrated in FIG. 9, the light emitting regions 53 are formed in the oxide layer 51. Since, in such a structure, the light emitting regions which are adjacent to each other share the oxidation regions, there is an advantage in that a density of the light emitting regions 53 can increase. That is, by minimizing the oxidation regions, areas of the light emitting regions 53 may be relatively increased. Accordingly, a maximum output value of light may increase per unit chip.

Figure 10A:
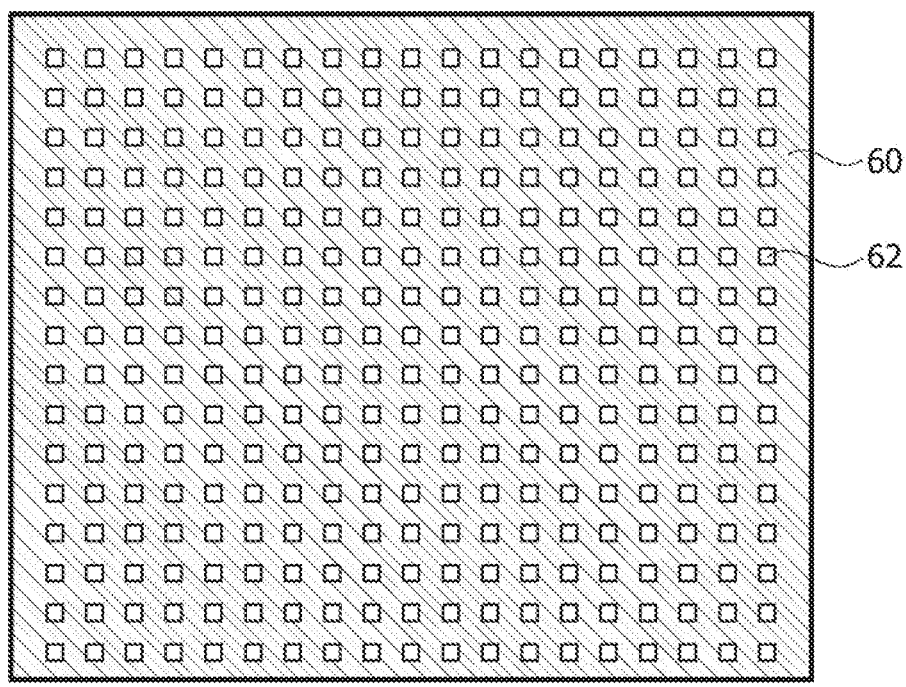
FIG. 10A is a plan view illustrating an upper electrode of FIG. 1.
Figure 10B:
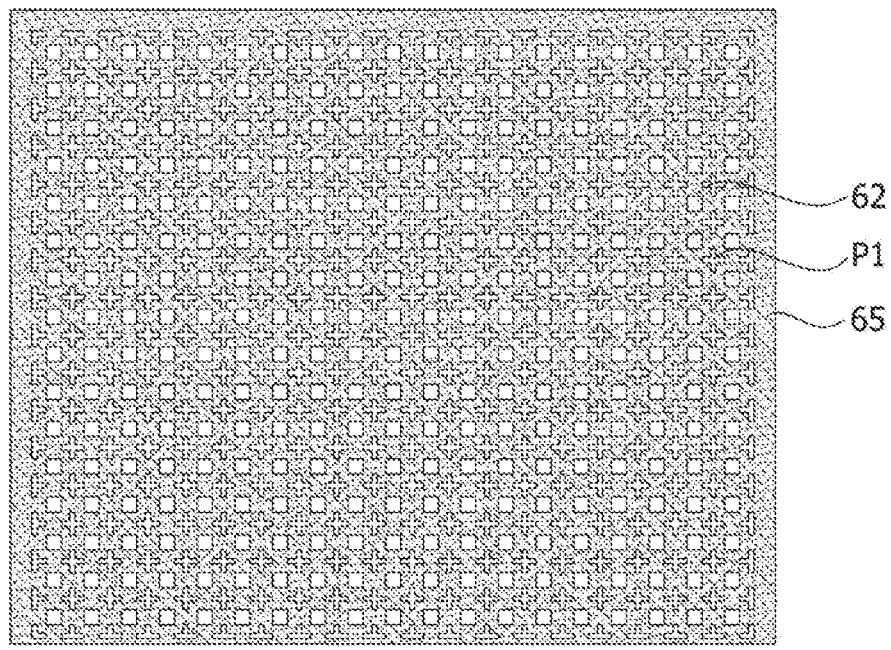
FIG. 10B is a plan view showing a region in which the upper electrode of FIG. 1 is electrically connected to an upper reflective layer.

FIG. 10A is a plan view illustrating the upper electrode of FIG. 1, and FIG. 10B is a plan view showing a region in which the upper electrode of FIG. 1 is electrically connected to the upper reflective layer.

Referring to FIG. 10A, the upper electrode 60 may include a plurality of second holes 62. In addition, referring to FIG. 10B, a region in which the upper electrode 60 and the upper reflective layer 40 are electrically connected may be the remaining region excluding the first holes P1 and the second holes 62. That is, according to the embodiment, an area in which the upper electrode 60 and the upper reflective layer 40 are electrically connected increases such as to decrease a contact resistance.

Figure 11:
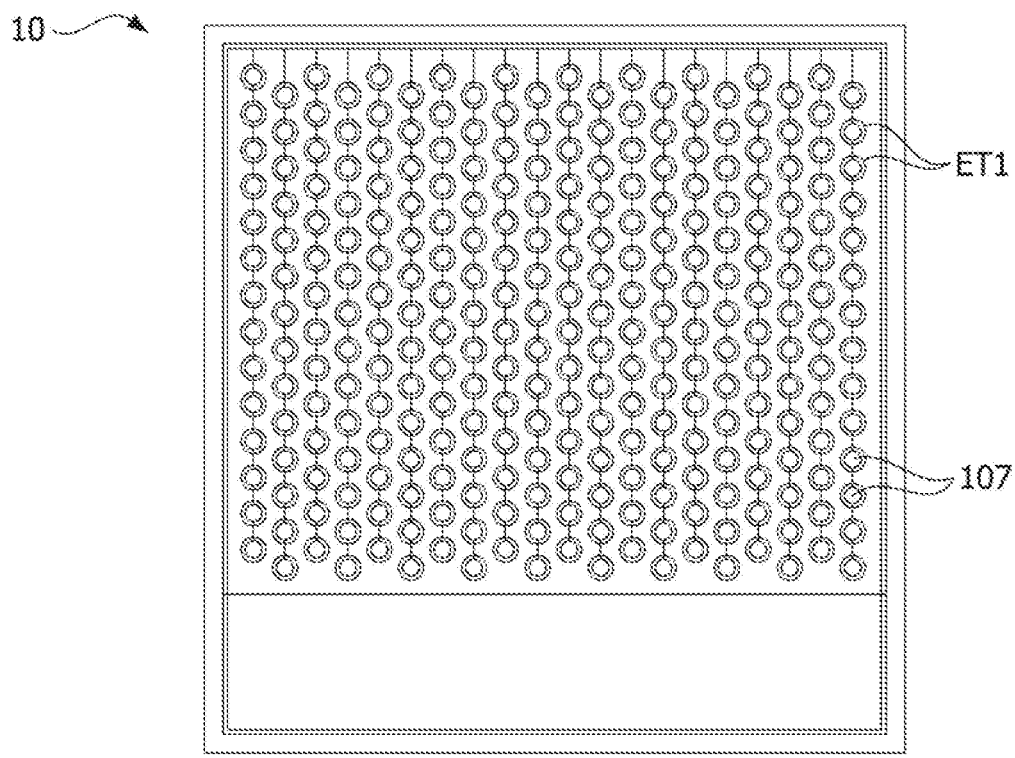
FIG. 11 is a plan view showing a conventional laser structure.
Figure 12A:
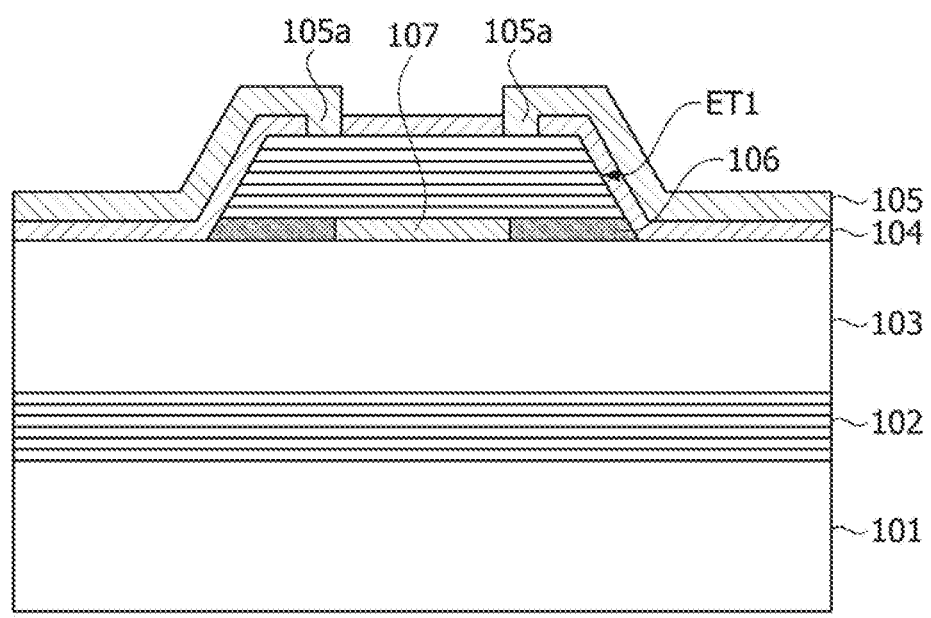
FIG. 12A is a partial cross-sectional view of the conventional laser structure.
Figure 12B:
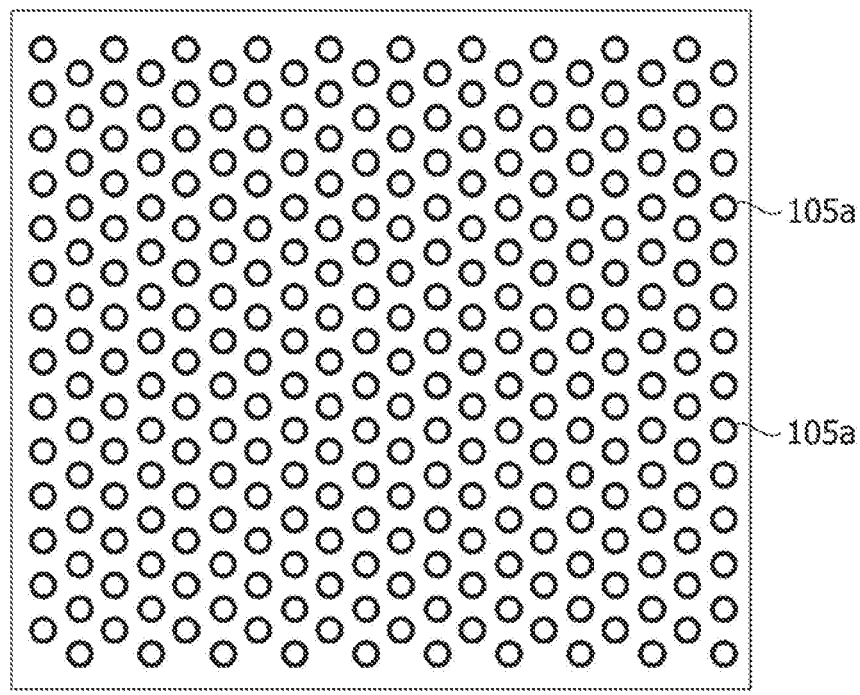
FIG. 12B is a plan view showing a region in which an upper electrode of FIG. 11 is electrically connected to an upper reflective layer.

FIG. 11 is a plan view showing a conventional laser array structure, FIG. 12A is a partial cross-sectional view of the conventional laser array structure, and FIG. 12B is a plan view showing a region in which an upper electrode of FIG. 11 is electrically connected to an upper reflective layer.

Referring to FIGS. 11 and 12A, in the conventional laser structure, a plurality of upper reflective layers ET1 may be isolated through mesa etching to form a plurality of light emitting portions (emitters). In this case, since an area 105a in which an ohmic electrode 105 is in contact with the upper reflective layers ET1 is small, there is a problem in that a contact resistance increases. The ohmic electrode 105 is not electrically connected to the upper reflective layers 103 due to an insulating layer 104 at outer sides of the plurality of light emitting portions.

Referring to FIG. 12B, a contact area 105a in which the ohmic electrode 105 is connected to the upper reflective layer 103 may be the sum of areas of a plurality of ring shapes. When compared to FIG. 10B, it can be seen that the contact area is very small (in the case of the conventional structure, an area in contact with the ohmic electrode is about 29% of a total area of a chip).

Figure 13A:
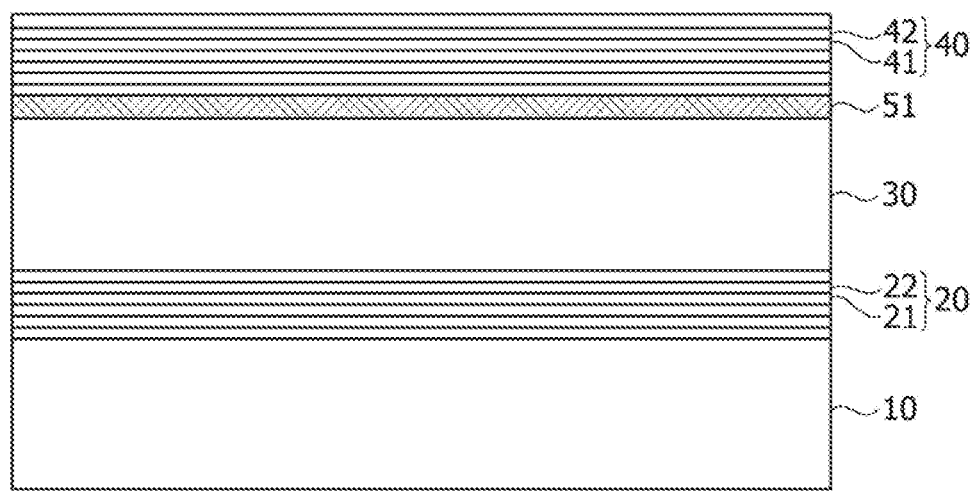
FIGS. 13A to 13D are views for describing a method of manufacturing a vertical cavity surface emitting laser according to one embodiment of the present invention.

FIGS. 13A to 13D are views for describing a method of manufacturing a VSCEL according to one embodiment of the present invention; Referring to FIG. 13A, a lower reflective layer 20, a laser cavity 30, an intermediate layer 43, an oxide layer 51, and an upper reflective layer 40 may be sequentially formed on a substrate 10. A structure of each of the layers may have all of the above-described features. The layers may be formed through an MOCVD method, a liquid phase epitaxy (LPE) method, an MBE method, or the like but are not necessarily limited thereto.

Figure 13B:
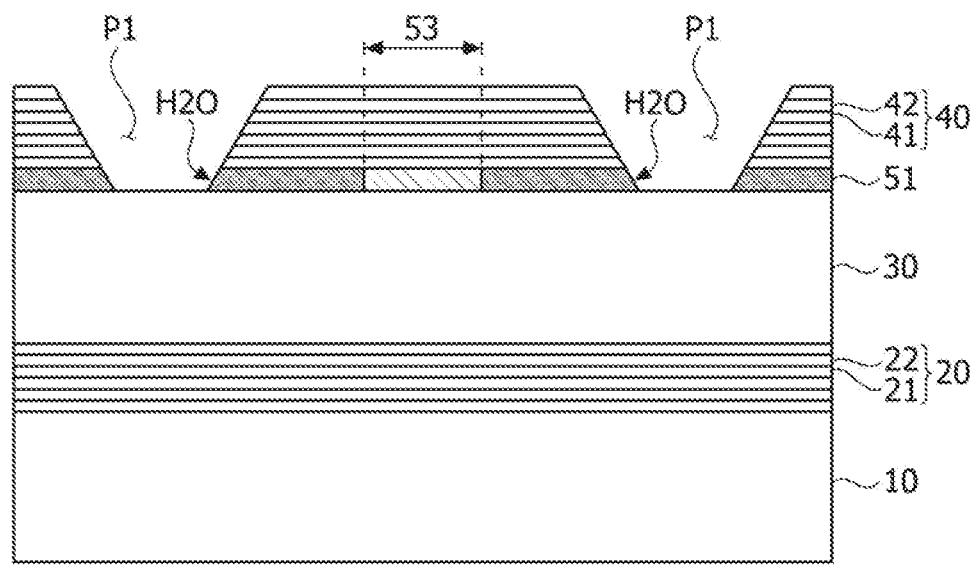

Referring to FIG. 13B, a plurality of first holes P1, which pass through the upper reflective layer 40 and the oxide layer 51, may be formed. The number of first holes P1 is not specifically limited. A shape of each of the plurality of holes is not specifically limited. The shape of the first hole P1 may be selected from various shapes such as a cross shape, a polygonal shape, and a radial shape. However, since oxidation should be performed along the plurality of first holes P1 to form uniform light emitting regions 53, it may be advantageous for the shape of the first hole P1 to be symmetrical with respect to a virtual line passing through a center thereof.

Side surfaces of the oxide layer 51 may be exposed through the plurality of first holes P1. Accordingly, when the oxide layer 51 is exposed to a mixed gas of $N_2$ and $H_2O$ at a high temperature (about 300° C. or more), oxidation may be performed from the side surfaces. Then, the oxidation may be performed until each of the light emitting regions 53 has a desired diameter.

Figure 13C:
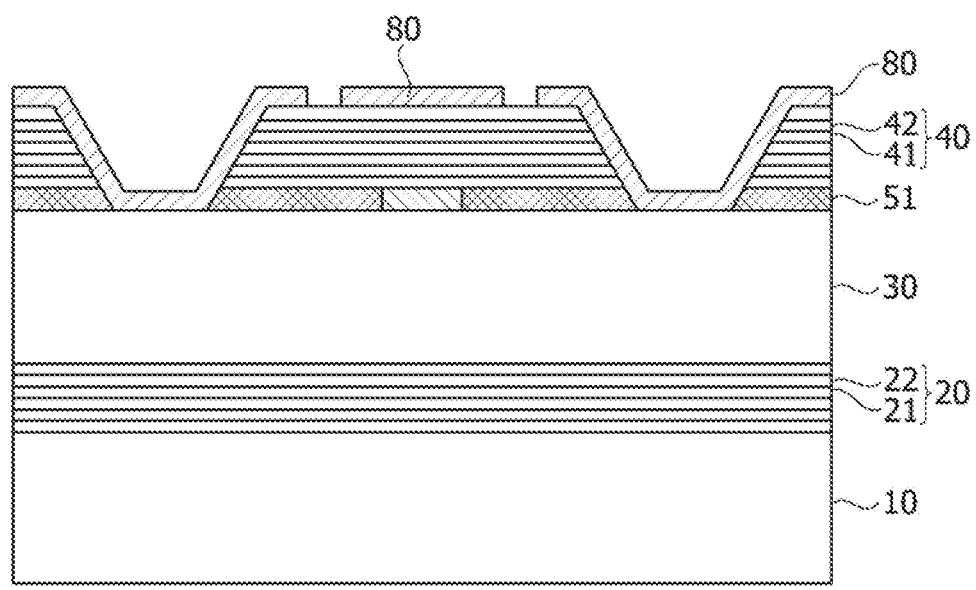

Referring to FIG. 13C, when the oxidation process is completed, an insulating layer 80 may be formed on inner sides of the first holes P2 and on the upper reflective layer 40. The insulating layer 80 may be formed of at least one of $SiO_2$, $Si_3N_4$, SiON, $Ta_2O_5$, $HfO_2$, BCB, and polyimide but is not necessarily limited thereto.

Figure 13D:
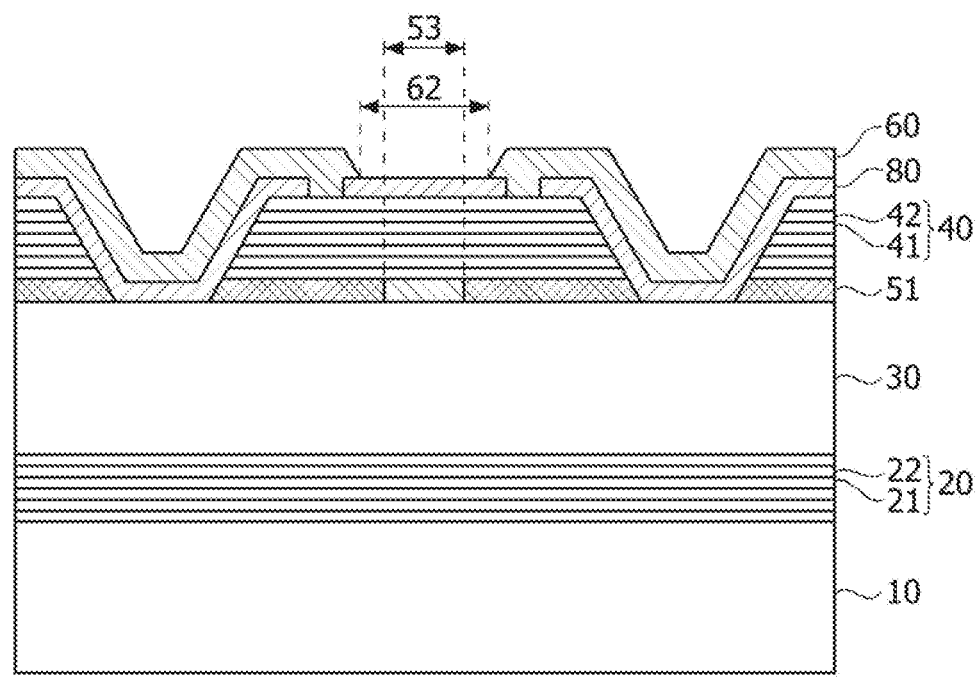

Referring to FIG. 13D, an upper electrode 60 may be formed on the insulating layer 80. Here, an ohmic electrode is inserted into via holes of the insulating layer 80, and thus the upper reflective layer 40 may be electrically connected to the upper reflective layer 40.

The upper electrode 60 may include a plurality of metal layers (for example, Ti/Pt/Au). Here, a thickness of a Ti layer may range from about 100 to 1,000 Å, and a thickness of an Au layer may range from 3,000 to 200,000 Å, but the present invention is not necessarily limited thereto.

FIGS. 14A to 14E are views illustrating various modified examples of the first hole.

The first hole P1 may have a shape selected from various shapes such as a cross shape, a polygonal shape, and a radial shape. However, since oxidation should be performed along the plurality of first holes P1 to form the uniform light emitting regions 53, it may be advantageous for the shape of the first hole P1 to be symmetrical with respect to a virtual line passing through a center thereof.

Figure 14A:
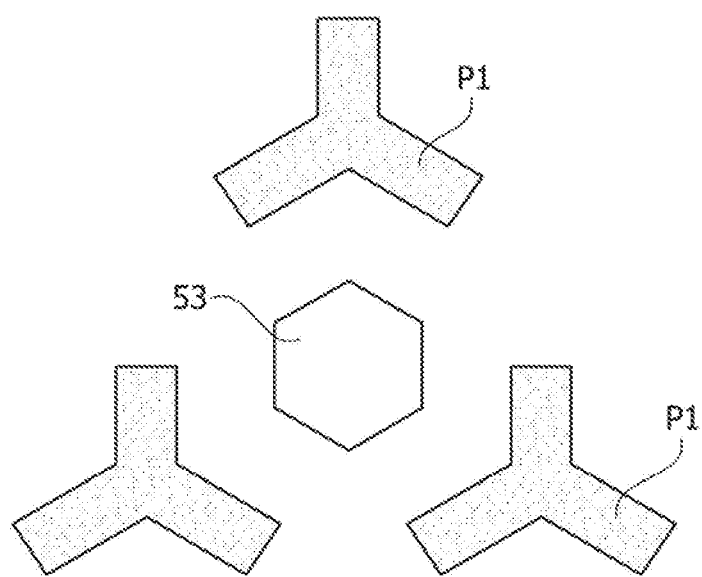
FIGS. 14A to 14E are views illustrating various modified examples of a first hole.

Referring to FIG. 14A, the first hole P1 may have a shape in which three extension portions radially extend from a center. In the case of such a structure, the light emitting region 53 may have a hexagonal shape. That is, since a shape of the light emitting region 53 is determined by the shape of the first hole P1, the light emitting regions 53 may have the same shape.

Figure 14B:
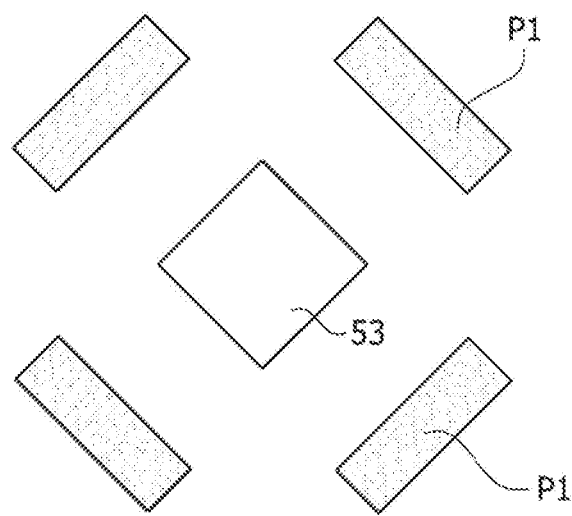
Figure 14C:
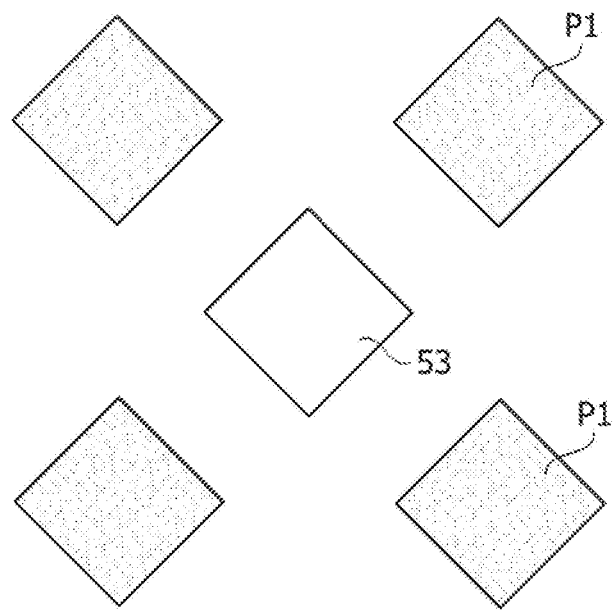

Referring to FIGS. 14B and 14C, the first hole P1 may have a rectangular or square shape. In this case, the light emitting region 53 may have a quadrilateral shape.

Figure 14D:
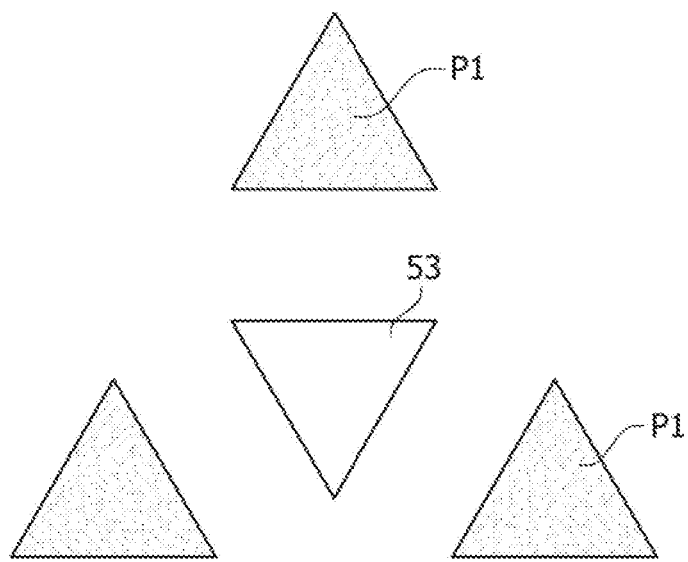

Referring to FIG. 14D, the first hole P1 may have a triangular shape. In this case, the light emitting region 53 may also have a triangular shape.

Figure 14E:
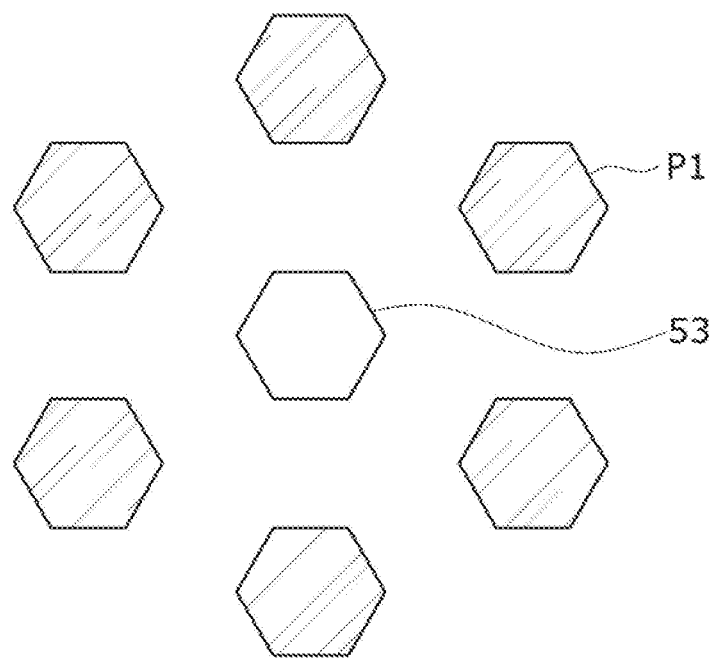

In addition, referring to FIG. 14E, the first hole P1 may have a hexagonal shape. In this case, the light emitting region 53 may also have a hexagonal shape. However, the first hole and the light emitting region are not necessarily limited thereto and may also have various polygonal shapes such as a pentagonal shape and an octagonal shape.

FIG. 15 is a plan view illustrating a VCSEL according to another embodiment 2 of the present invention, and FIG. 16 is a partially enlarged view of FIG. 15.

Referring to FIGS. 15 and 16, in a VCSEL according to the embodiment, a plurality of through holes 54 arrayed in a matrix form are disposed, and a plurality of first holes P2 are disposed to surround the through holes 54. The through holes 54 may serve as emitters from which an oxide layer is removed and may be formed as light emitting regions which emit laser light. As will be described below, the plurality of first holes P2 serve a function of exposing an oxide layer 51 such that an oxidation process may be performed on the oxide layer 51.

A diameter of each of the through holes 54 may be greater than the diameter of each of the first holes P2. For example, in a case in which a size of an array chip is 750 μm×780 μm, the diameter of the through hole 54 may range from 3 μm to 100 μm, and the diameter of the first hole P2 may range from 2 μm to 5 μm. The number of through holes 54 may range from 200 to 400, and the number of first holes P2 may range from 50 to 300, but the present invention is not limited thereto.

An area of the first hole P2 may range from 0.1% to 50% of an area of the through hole 54. In a case in which the area of the first hole P2 is less than 0.1% of the area of the through hole 54, since the area of the first hole P2 is too small, there is a problem in that a time period of the oxidation process for the oxide layer 51 increases, and in a case in which the area of the first hole P2 is greater than 50% of the area of the through hole 54, since the area of the through hole 54 is small, optical output may decrease.

However, the present invention is not necessarily limited thereto, and the diameter of the first hole P2 may also be greater than that of the through hole 54. In addition, the first hole P2 may have various shapes in addition to a circular shape.

Figure 17:
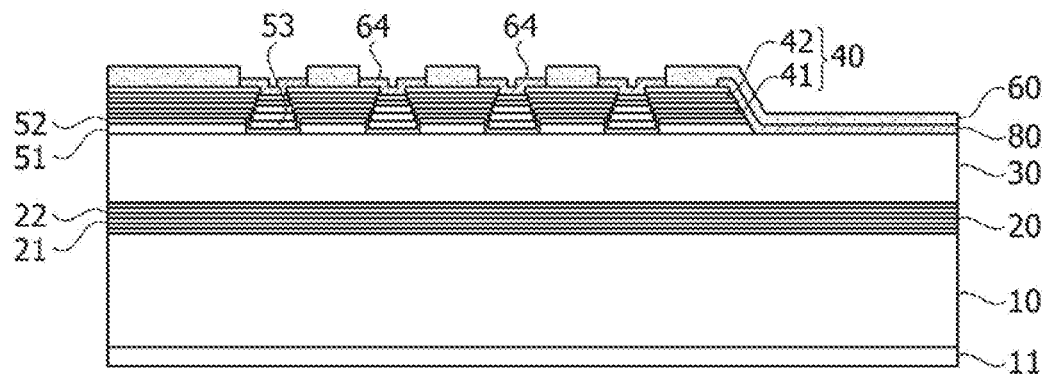
FIG. 17 is a cross-sectional view taken along line F-F of FIG. 15.
Figure 18:
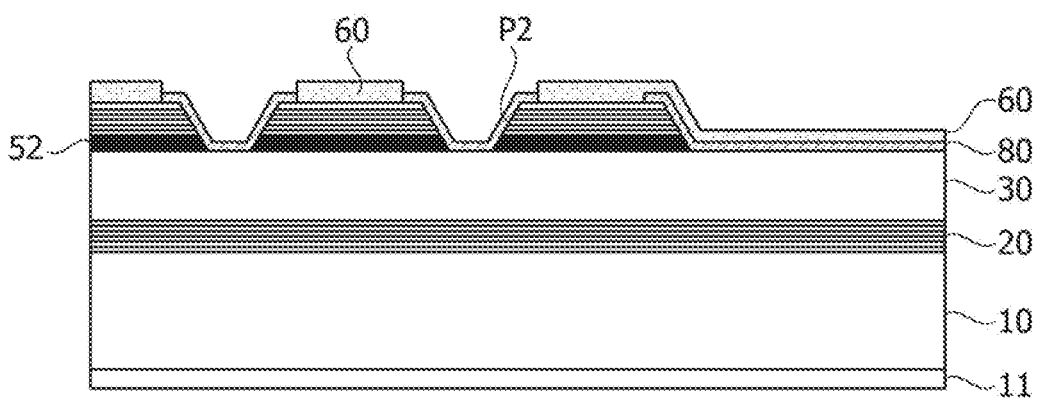
FIG. 18 is a cross-sectional view taken along line G-G of FIG. 15.
Figure 19:
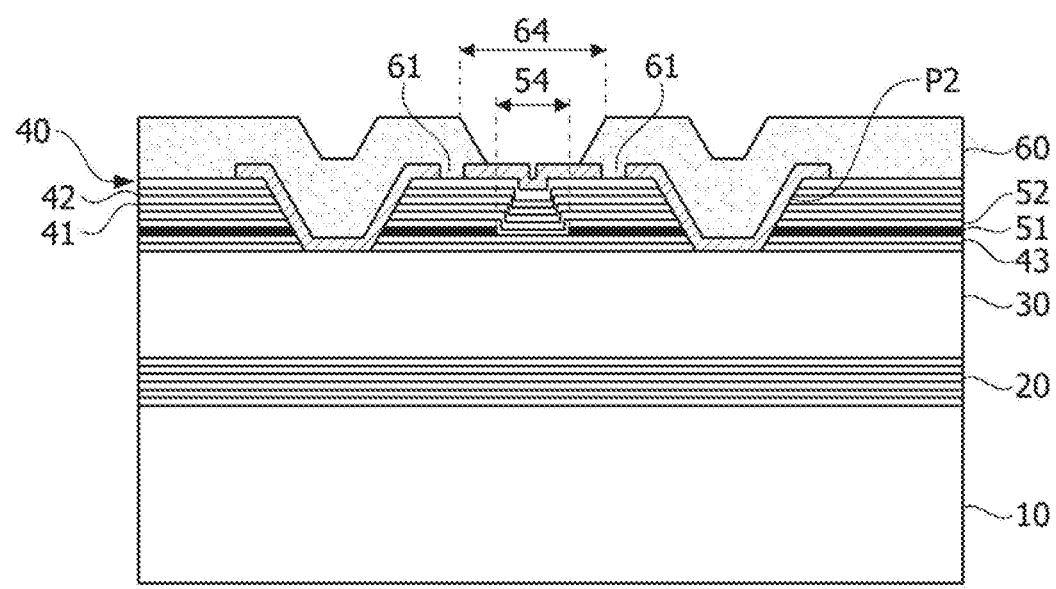
FIG. 19 is a cross-sectional view taken along line H-H of FIG. 15.
Figure 20:
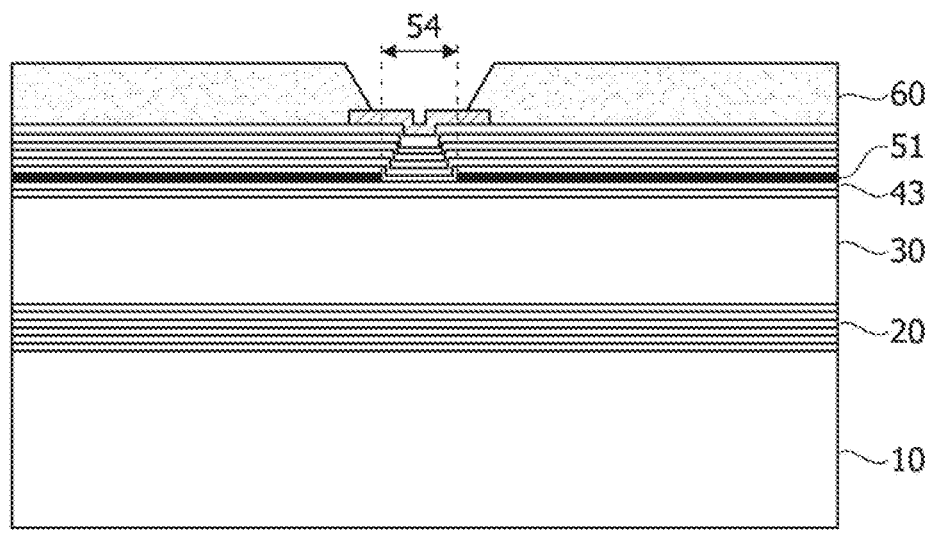
FIG. 20 is a cross-sectional view taken along line I-I of FIG. 15.

FIG. 17 is a cross-sectional view taken along line F-F of FIG. 15, FIG. 18 is a cross-sectional view taken along line G-G of FIG. 15, FIG. 19 is a cross-sectional view taken along line H-H of FIG. 15, and FIG. 20 is a cross-sectional view taken along line I-I of FIG. 15.

A substrate 10 may be a semi-insulating or conductive substrate 10. For example, the substrate 10 may be a GaAs substrate with a high doping concentration, and the doping concentration may range from about $1\times10^7$ cm$^{-3}$ to $1\times10^{19}$ cm$^{-3}$. As necessary, a buffer layer such as an AlGaAs or GaAs thin film may be further disposed on the substrate 10 but is not necessarily limited thereto.

A lower reflective layer 20 may include a distributed Bragg reflector (DBR) having an N-type superlattice structure. The lower reflective layer 20 may be epitaxially deposited on the substrate 10 through an MOCVD method, an MBE method, or the like.

The lower reflective layer 20 may serve an internal reflection function in a VCSEL structure. In the lower reflective layer 20, a plurality of first lower reflective layers 21 and a plurality of second lower reflective layers 22 may be alternately stacked. Both of the first lower reflective layers 21 and the second lower reflective layers 22 may be formed of AlGaAs or AlGaAsP, and a proportion of aluminum in each of the first lower reflective layers 21 may be greater than a proportion of aluminum in each of the second lower reflective layers 22.

A reflectivity of the lower reflective layer 20 may depend on a difference in refractive index between the first lower reflective layers 21 and the second lower reflective layers 22 and depend on the number of the first lower reflective layers 21 and the second lower reflective layers 22 which are stacked. Accordingly, in order to obtain high reflectivity to secure high VCSEL properties, it may be advantageous when a difference in refractive index is larger and the number of the stacked layers is smaller.

A laser cavity 30 may include one or more well layers and barrier layers. The well layer may be formed of one selected from among GaAs, AlGaAs, AlGaAsSb, InAlGaAs, AlInGaP, GaAsP, and InGaAsP, and the barrier layer may be formed of one selected from among AlGaAs, InAlGaAs, InAlGaAsP, AlGaAsSb, GaAsP, AlGaAsP, GaInP, AlInGaP, and InGaAsP.

The laser cavity 30 may be designed to provide a sufficient optical gain. For example, the laser cavity 30 according to the embodiment may include a center having the well layer which has a thickness and a composition ratio which are suitable to emit light in a wavelength band ranging from about 800 nm to 900 nm. However, a wavelength band of a laser output by the well layer is not specifically limited.

The laser cavity 30 may include a first semiconductor layer (not shown) disposed under an active layer and a second semiconductor layer (not shown) disposed on the active layer. The first semiconductor layer may be an N-type semiconductor layer, and the second semiconductor layer may be a P-type semiconductor layer, but the present invention is not necessarily limited thereto. Each of the first semiconductor layer and the second semiconductor layer may be undoped with a dopant. For example, each of the first semiconductor layer and the second semiconductor layer may be formed of AlGaAs but is not necessarily limited thereto.

An oxide layer 51 may be disposed on the laser cavity 30. The oxide layer 51 may be doped with a dopant which is the same kind as that of an upper reflective layer 40. For example, the oxide layer 51 may be doped with a P-type dopant having a concentration of about $10^{18}$ cm$^{-3}$ but is not necessarily limited thereto.

The oxide layer 51 may include a semiconductor compound including aluminum such as AlAs, AlGaAs, and InAlGaAs. The through hole 54 may be disposed at a center of the oxide layer 51 according to the embodiment. The through hole 54 may have a circular shape, an oval shape, or a polygonal shape. The oxide layer 51 may have donut shapes in which holes are formed at centers of the shapes.

The oxide layer 51 may have a relatively high resistance but may have a relatively low refractive index. Accordingly, since a current may flow into the through holes 54, laser light may be collected at a center of an element. That is, a current and light may pass through the through holes 54. Accordingly, the through hole 54 may serve a function of being a light emitting region.

In the embodiment, when the oxide layer 51 in which the through hole 54 is formed is completely oxidized, a region, which is to be oxidized, is not present anymore. This is because a proportion of aluminum in the upper reflective layer 40 disposed on inner sides of the through holes 54 is relatively low, and thus the upper reflective layer 40 may not be easily oxidized even when exposed to oxygen. That is, the upper reflective layer 40 disposed on the inner sides of the through holes 54 may serve as a stopper of an oxidation reaction which automatically finishes oxidation.

Accordingly, there is an advantage in that, even when an oxidation extent is not precisely controlled, an oxide opening corresponding to a size and a shape of the through hole 54 can be obtained. Accordingly, a manufacturing process can be simplified, and yield can be increased. In addition, uniform oxide apertures can be simultaneously formed.

A proportion of aluminum in the oxide layer 51 may range from 80% to 100%. In a case in which the proportion of aluminum in the oxide layer 51 is 80% or less, there is a problem in that an oxidation speed decreases such as to increase a process time period.

A capping layer 52 may be further disposed on the oxide layer 51. The capping layer 52 may prevent the oxide layer 51 from being exposed to an external environment during or after a process.

As described above, in order to easily oxidize the oxide layer 51, the oxide layer 51 may be designed such that the proportion of aluminum and a doping concentration are high. Accordingly, in a case in which the capping layer 52 is not provided, the oxide layer 51 may also has been oxidized in advance before an oxidation process is performed.

Since it is difficult to grow a semiconductor layer on the oxidized oxide layer 51 in advance, it may be difficult to grow the upper reflective layer 40 thereon. Accordingly, the capping layer 52 can prevent the oxide layer 51 from being oxidized in advance before the oxidation process.

The oxide layer 51 according to the embodiment may include a semiconductor compound including aluminum such as AlAs, AlGaAs, and InAlGaAs. That is, the oxide layer 51 according to the embodiment may include As such that the upper reflective layer 40 may be formed thereon.

The capping layer 52 may be formed of at least one from among GaAs, AlGaAs, InAlGaAs, AlGaAsSb, AlGaAsP, GaInP, InGaAsP, and AlInGaP but is not necessarily limited thereto.

In addition, the capping layer 52 may be formed to have one or more layers formed of one or more materials selected from GaAs, AlGaAs, InAlGaAs, AlGaAsSb, AlGaAsP, GaInP, InGaAsP, and AlInGaP.

In a case in which the capping layer 52 includes aluminum, a proportion of aluminum in the capping layer 52 may be less than the proportion of aluminum in the oxide layer 51. For example, the proportion of aluminum of the capping layer 52 may range from 0% to 60% thereof. In a case in which the proportion of aluminum in the capping layer 52 is greater than 60% thereof, there may be a problem in that a surface of the capping layer 52 is exposed to air, and thus the surface is oxidized during a process, and even after the upper reflective layer 40 is formed, there may be a problem in that the capping layer 52 is also oxidized when the oxide layer 51 is oxidized.

A thickness of the capping layer 52 may range from 2.5 Å to 5,000 Å. In a case in which the thickness of the capping layer 52 is 2.5 Å or less, there is a problem in that the capping layer 52 is too thin to effectively prevent penetration of oxygen, and in a case in which the thickness is 5,000 Å or more, there is a problem in that a step of the upper reflective layer 40 is too large so that it is difficult to form a uniform interface when the upper reflective layer 40 is regrown.

An intermediate layer 43 may be provided between the laser cavity 30 and the oxide layer 51. The intermediate layer 43 may include a first intermediate layer and a second intermediate layer. A structure of the intermediate layer may be the same as the above-described structure thereof.

The upper reflective layer 40 may be disposed on the inner sides of the through holes 54 and on the oxide layer 51. The upper reflective layer 40 may include a plurality of first upper reflective layers 41 and a plurality of second upper reflective layers 42 which are disposed on the capping layer 52 and/or at the inner sides of the through holes 54.

Each of the first upper reflective layers 41 may include AlGaAs, and each of the second upper reflective layers 42 may include GaAs. Accordingly, a proportion of aluminum in the first upper reflective layer 41 may be greater than a proportion of aluminum in the second upper reflective layer 42.

The upper reflective layer 40 may be doped to have a polarity which is different from that of the lower reflective layer 20. For example, when each of the lower reflective layer 20 and the substrate 10 is doped with an N-type dopant, the upper reflective layer 40 may be doped with a P-type dopant.

In order to emit laser light in a direction opposite from the substrate 10, the upper reflective layer 40 may have layers in which the number thereof is less than the number of layers of the lower reflective layer 20 to decrease a reflectivity from the VCSEL. That is, the reflectivity of the upper reflective layer 40 may be lower than that of the lower reflective layer 20.

An upper electrode 60 may be disposed on the upper reflective layer 40, and a lower electrode 11 may be disposed under the substrate 10. However, the lower electrode 11 is not necessarily limited thereto, and an upper portion of the substrate 10 is exposed, and the lower electrode 11 may also be disposed on the exposed portion.

Each of the upper electrode 60 and the lower electrode 11 may be formed to include at least one among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrO$_x$, RuO$_x$, NiO, RuO$_x$/ITO, Ni/IrO$_x$/Au or Ni/IrO$_x$/Au/ITO, Ag, Ni, Cr, Ti, Al, Rh, Pd, Ir, Sn, In, Ru, Mg, Zn, Pt, Au, and Hf but is not limited to such materials.

For example, the upper electrode 60 may include a plurality of metal layers (for example, Ti/Pt/Au). Here, a thickness of a Ti layer may range from about 100 to 1,000 Å, and a thickness of an Au layer may range from 3,000 to 200,000 Å, but the present invention is not necessarily limited thereto.

The lower electrode 11 may include a plurality of metal layers (for example, AuGe/Ni/Au). Here, a thickness of an AuGe layer may be 1,000 Å, a thickness of an Ni layer may be 100 Å, and a thickness of an Au layer may be 2,000 Å, but the present invention is not necessarily limited thereto.

An ohmic layer may be further disposed between the upper electrode 60 and the upper reflective layer 40. The ohmic layer may include a material having a band gap which is less than or equal to that of the GaAs substrate 10 and is less than or equal to that of energy of emitted laser light. For example, the ohmic electrode may be formed of one selected from among AlInGaAs, InGaAs, GaAs, AlInGaAsSb, AlInGaAsPSb, InGaAsP, InGaAsPSb, GaAsSb, InGaAsSb, InAsSb, AlGaAsSb, AlGaAsP, and AlGaInAsP.

Referring to FIG. 19, an insulating layer 80 may be disposed on inner sides of the first holes P2 and may prevent the upper electrode 60 from being in direct contact with the laser cavity. Accordingly, since a current flows through both of a contact region 61 in which the semiconductor is in contact with the upper electrode 60 and the through hole 54 and flows into the laser cavity 30 in a unit light emitting region, light can be concentrated in the through hole 54. In addition, the insulating layer 80 may be disposed between the through holes 54 and second holes 64 and prevent the through holes 54 from being exposed to the outside.

The first holes P2 may be formed to pass through the upper reflective layer 40 and the oxide layer 51. Accordingly, since the oxide layer 51 may be exposed to the outside through the first holes P2, the oxide layer 51 may be oxidized. Even when oxidation starts from peripheries of the first holes P2, since the oxidation is finished at the through holes 54, a shape of the through hole of oxidation area may be determined by a shape of the through hole 54.

Referring to FIG. 20, regions, in which the first holes P2 are not formed, of the upper electrode 60 may be electrically connected to be formed as one layer. In addition, the insulating layer 80 may be removed from regions in which the first holes P2 are not formed, and thus an area in which the upper electrode 60 is electrically connected to the upper reflective layer 40 may be increased. Accordingly, a contact resistance decreases, and thus an operating voltage can decrease. Accordingly, since an increase in temperature in the VCSEL may be reduced, photoconversion efficiency can be high, and light with high output power can be emitted. In addition, a lifespan of the VCSEL or a VCSEL array can increase.

Figure 21A:
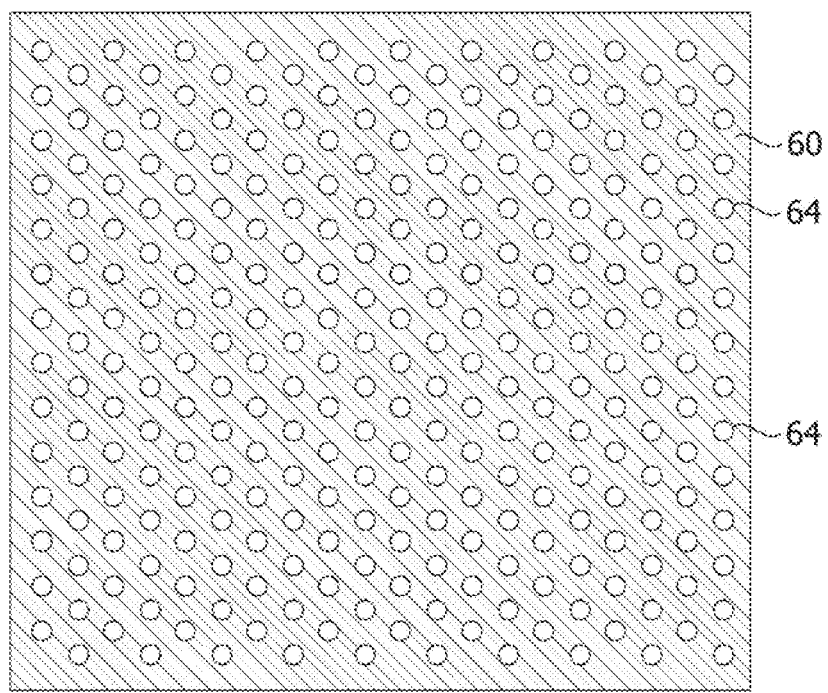
FIG. 21A is a plan view illustrating an upper electrode of FIG. 15.
Figure 21B:
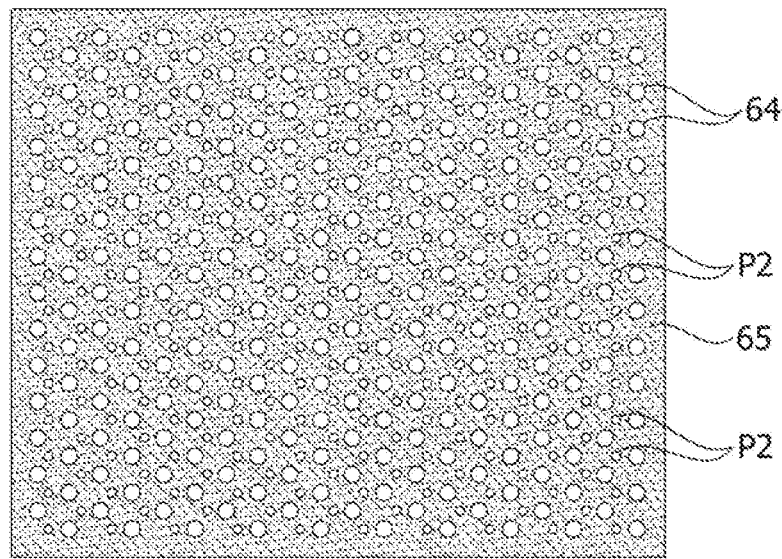
FIG. 21B is a plan view illustrating a region in which the upper electrode of FIG. 15 is electrically connected to an upper reflective layer.

FIG. 21A is a plan view illustrating an upper electrode of FIG. 15, and FIG. 21B is a plan view illustrating a region in which the upper electrode of FIG. 15 is electrically connected to an upper reflective layer.

Referring to FIG. 21A, the upper electrode 60 may include the plurality of second holes 64. In addition, referring to FIG. 21B, a region in which the upper electrode 60 and the upper reflective layer 40 are electrically connected may be the remaining region excluding the first holes P2 and the second holes 64. That is, according to the embodiment, a contact area of the upper electrode 60 and the upper reflective layer 40 may increase to decrease a contact resistance.

FIGS. 22A to 22E are views for describing a method of manufacturing a VCSEL according to another embodiment of the present invention.

Figure 22A:
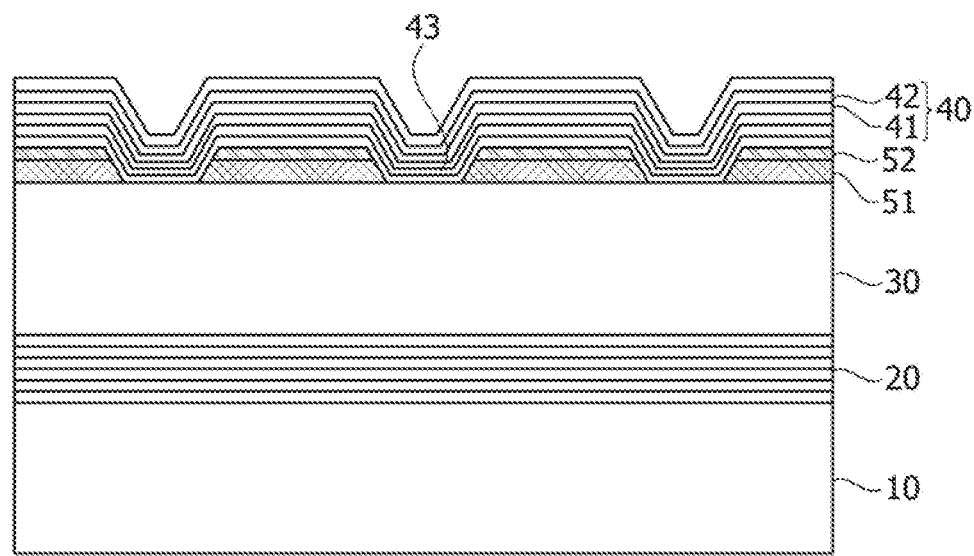
FIGS. 22A to 22E are views for describing a method of manufacturing a vertical cavity surface emitting laser according to another embodiment of the present invention.

Referring to FIG. 22A, a lower reflective layer 20, a laser cavity 30, an oxide layer 51, a capping layer 52, and an upper reflective layer 40 may be sequentially formed on the substrate 10. A structure of each of the layers may have all of the above-described features.

Specifically, a plurality of through holes 54 are formed in the oxide layer 51 and the capping layer 52, and the upper reflective layer 40 may be formed thereon. Accordingly, some portions of the upper reflective layer 40 may be disposed on the inner sides of the through holes 54.

Figure 22B:
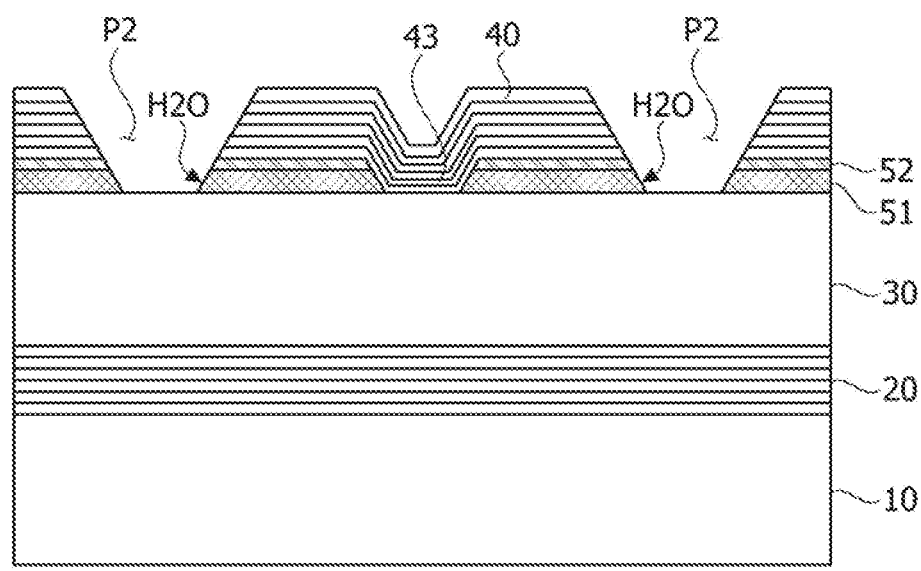

The semiconductor structure may be formed through an MOCVD method, a LPE method, an MBE method, or the like but is not necessarily limited thereto. Referring to FIG. 22B, a plurality of first holes P2, which pass through the upper reflective layer 40, the capping layer 52, and the oxide layer 51, may be formed. The number of first holes P2 is not specifically limited. A shape of each of the plurality of holes is not specifically limited. The shape of the first hole P2 may be selected from various shapes such as a circular shape, a cross shape, a polygonal shape, and a radial shape.

Figure 22C:
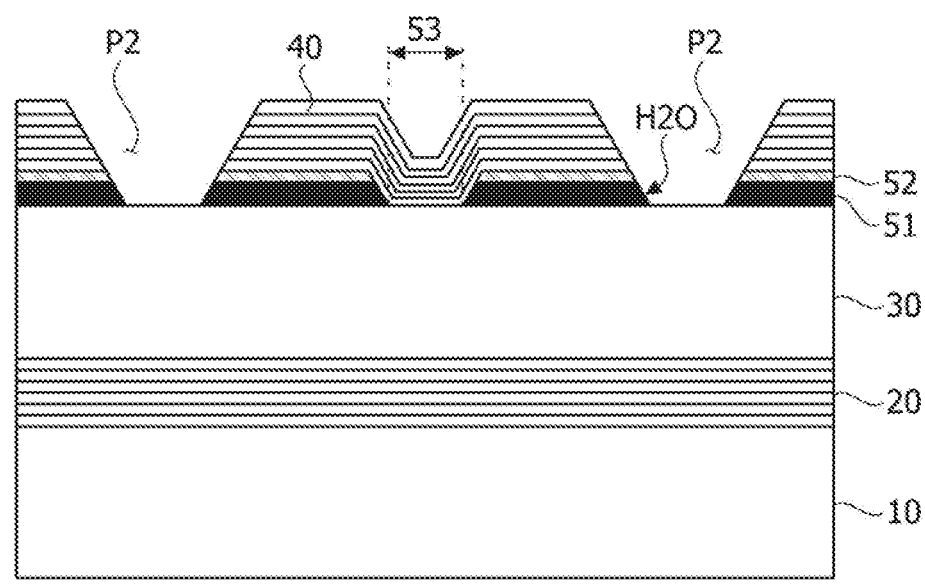

Side surfaces of the oxide layer 51 may be exposed through the plurality of first holes P2. Accordingly, when the oxide layer 51 is exposed to a mixed gas of N$_2$ and H$_2$O, oxidation may be performed from the side surfaces. As illustrated in FIG. 22C, the oxidation process may be performed until the oxide layer 51 is completely oxidized excluding the through holes 54.

Figure 22D:
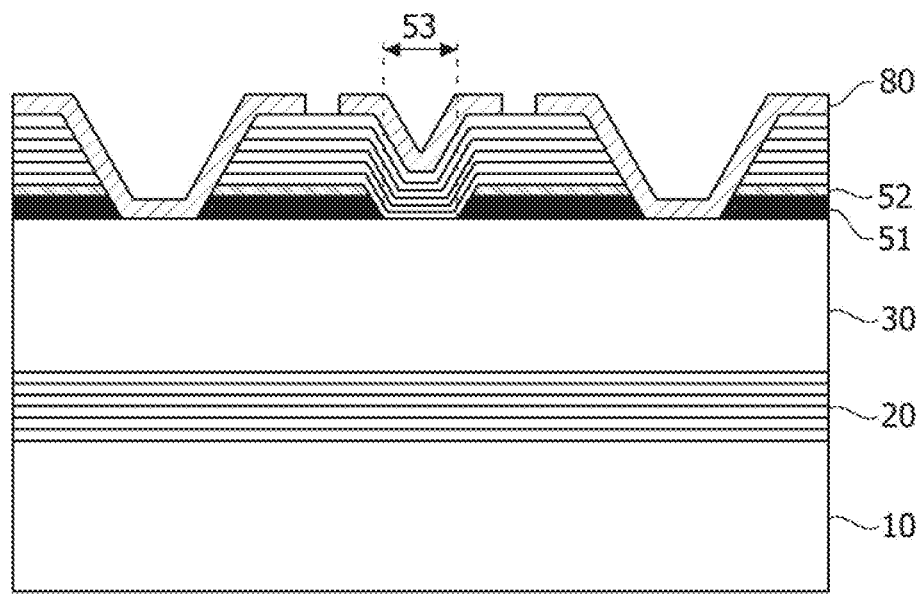
Figure 22E:
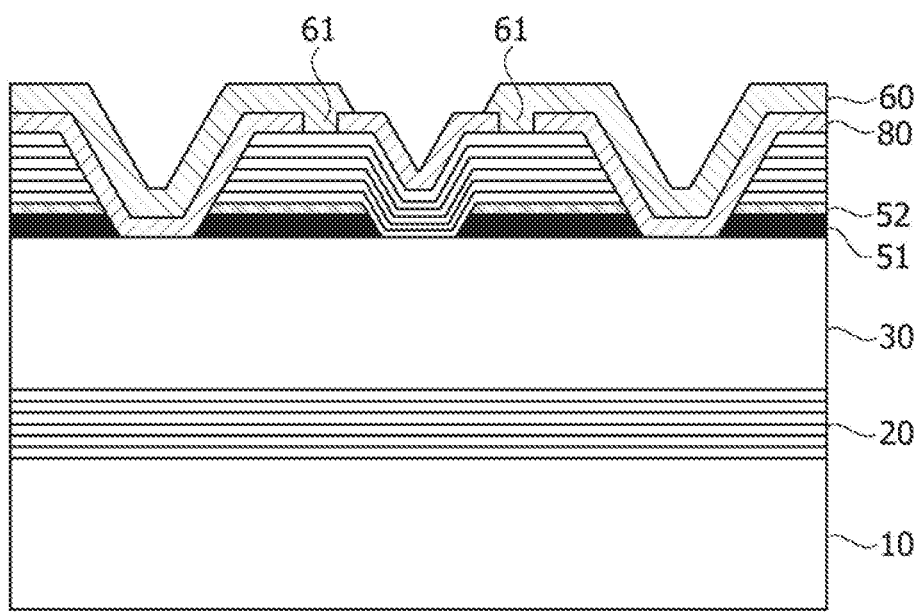

Referring to FIG. 22D, when the oxidation process is completed, an insulating layer 80 may be formed on the inner sides of the first holes P2 and on the upper reflective layer 40. The insulating layer 80 may be formed of at least one of SiO$_2$, Si$_3$N$_4$, SiON, Ta$_2$O$_5$, HfO$_2$, BCB, and polyimide but is not necessarily limited thereto.

Referring to FIG. 22D, the upper electrode 60 may be formed on the insulating layer 80. Here, the upper electrode 60 may be electrically connected to the upper reflective layer 40 by via holes formed in the insulating layer 80 in advance. The upper electrode 60 may include a plurality of metal layers (for example, Ti/Pt/Au). Here, a thickness of a Ti layer may range from about 100 to 10,000 Å, and a thickness of an Au layer may range from 3,000 to 200,000 Å, but the present invention is not necessarily limited thereto.

Before the upper electrode 60 is formed, the ohmic layer may be formed. The ohmic layer may be formed of one selected from among AlInGaAs, InGaAs, GaAs, AlInGaAsSb, AlInGaAsPSb, InGaAsP, InGaAsPSb, GaAsSb, InGaAsSb, InAsSb, AlGaAsSb, AlGaAsP, and AlGaInAsP.

Below Table 1 is a comparison table showing properties of VCSEL array chips in which the conventional technology, Embodiment 1, and Embodiment 2 are applied.

TABLE 1

| Structure | Area in Contact with Ohmic Electrode to Total Area of Chip. | Relative Resistance Ratio |
|---|---|---|
| Conventional Structure | 29% | 100% |
| Embodiment 1 | 79% | 73% |
| Embodiment 2 | 88% | 58% |

The laser element according to the present embodiment may be use or a light source for a three-dimensional (3D) face recognition technology and a 3D imaging technology. The 3D face recognition technology and the 3D imaging technology require a light source matrix structured in a two-dimensional array form. Light may be emitted to an object by the light source matrix structured in the two-dimensional array form, and a pattern of reflected light may be analyzed. Here, when a changed state of element lights emitted by the light source matrix structured in the two-dimensional array form and reflected by a bent surface of an object having various shapes is analyzed, a three-dimensional image of the object can be generated. When the light source structured in the two-dimensional array form is manufactured using the VCSEL array according to the embodiment, a light source matrix structured in the two-dimensional array form, in which properties of an element light source are uniform, can be provided. However, the VCSEL for the application may require an optical element in which optical output ranges from several to several tens of watts, a pulse is short, such as 1 to 10 ns, optical modulation for 100 MHz or more is possible, and efficiency is high, that is, power consumption is low. A modulation equivalent circuit of an optical element can be represented by a resistor-capacitor (RC) circuit, and in the RC circuit, a time constant which determines a modulation speed can be denoted by a multiple of a resistance and a capacity. Accordingly, it is important to secure a low resistance to realize an element which modulates at a high speed and has high photoconversion efficiency. Accordingly, the present invention can provide a most suitable solution to provide a light source for 3D face recognition and 3D imaging. In addition, the laser element according to the present invention may be used as a low cost VCSEL source in the application fields such as an optical communication device, a closed-circuit television (CCTV), a vehicle night vision, motion recognition, a medical/therapeutic purpose, a telecommunication device for Internet of things (IOT), a heat tracing camera, a thermal imaging camera, solid state laser (SOL) pumping, and a heating process for bonding plastic films.

As described above, since a contact area of an ohmic electrode increases, a contact resistance and an operating voltage can decrease.

In addition, since a density of light emitting regions which emits a laser increases, photoconversion efficiency is high and an output value of optical power can increase.

Various useful advantages and effects of the present invention are not limited to the above-described advantages and can be easily understood in a process in which specific embodiments are described.

While the present invention has been mainly described above with reference to the embodiments, it will be understood by those skilled in the art that the invention is not limited to the embodiments, but the embodiments are only examples, and various modifications and applications which are not illustrated above may fall within the range of the present invention without departing from the essential features of the present embodiments. For example, components specifically described in the embodiments may be modified and implemented. In addition, it should be understood that differences related to modifications and applications fall within the scope of the present invention defined by the appended claims.

What is claimed is:

1. A vertical cavity surface emitting laser comprising:
   a substrate;
   a lower reflective layer disposed on the substrate;
   a laser cavity including an active layer and disposed on the lower reflective layer;
   an oxide layer disposed on the laser cavity and including a plurality of through holes;
   a capping layer disposed on the oxide layer and including a plurality of through holes;
   an upper reflective layer disposed on the capping layer;
   a plurality of first holes formed in the upper reflective layer and the oxide layer;
   an upper electrode disposed on inner sides of the plurality of first holes and disposed on the upper reflective layer; and
   an insulating layer disposed between the upper reflective layer and the upper electrode,
   wherein the upper reflective layer includes a plurality of recess portions disposed on the plurality of through holes of the oxide layer and the capping layer,
   wherein the upper electrode includes a plurality of second holes overlapping the plurality of recess portions in a vertical direction,
   wherein the insulating layer includes a plurality of first insulating portions disposed in the plurality of first holes and a plurality of second insulating portions overlapping the plurality of through holes,
   wherein the upper electrode is entirely electrically connected to the upper reflective layer in a region which does not overlap the plurality of first insulating regions and the plurality of second insulating regions,
   a plurality of light emitting portions overlapping the plurality of second holes includes the plurality of through holes and the plurality of recess portions,
   wherein the plurality of first holes are separated each other so that the plurality of light emitting portions are connected each other, and
   wherein the oxide layer is shared among the plurality of light emitting portions and the upper reflect layers is shared among the plurality of light emitting portions.

2. The vertical cavity surface emitting laser of claim 1, wherein an area of each of the plurality of second holes is greater than an area of each of the through holes.

3. The vertical cavity surface emitting laser of claim 1, wherein a diameter of each of the first holes is less than a diameter of each of the through holes.

4. The vertical cavity surface emitting laser of claim 1, wherein an area of the upper electrode ranges from 65% to 85% of an area of the laser cavity.

5. The vertical cavity surface emitting laser of claim 1, wherein an area of each of the first holes ranges from 10% to 40% of an area of each of the through holes.

6. The vertical cavity surface emitting laser of claim 1, wherein each of the through holes has at least one shape among a cross shape, a polygonal shape, a circular shape, and a radial shape.

* * * * *